(12) United States Patent
Pynn et al.

(10) Patent No.: US 11,175,447 B1
(45) Date of Patent: Nov. 16, 2021

(54) WAVEGUIDE IN-COUPLING USING POLARIZED LIGHT EMITTING DIODES

(71) Applicant: Facebook Technologies, LLC, Menlo Park, CA (US)

(72) Inventors: Christopher Pynn, Cork (IE); Anneli Munkholm, Bellevue, WA (US); Hee Yoon Lee, Kirkland, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/539,940

(22) Filed: Aug. 13, 2019

(51) Int. Cl.
| | | |
|---|---|---|
| G02B 27/01 | (2006.01) | |
| H01L 33/32 | (2010.01) | |
| H01L 33/06 | (2010.01) | |
| F21V 8/00 | (2006.01) | |
| H01L 33/58 | (2010.01) | |
| H01L 33/24 | (2010.01) | |

(52) U.S. Cl.
CPC ......... *G02B 6/0073* (2013.01); *G02B 6/0023* (2013.01); *G02B 27/0172* (2013.01); *H01L 33/06* (2013.01); *H01L 33/24* (2013.01); *H01L 33/32* (2013.01); *H01L 33/58* (2013.01); *G02B 6/003* (2013.01); *G02B 6/0026* (2013.01); *G02B 2027/0178* (2013.01)

(58) Field of Classification Search
CPC .. G02B 6/0073; G02B 6/0023; G02B 6/0026; G02B 6/003; G02B 27/0172; G02B 2027/0178; H01L 33/06; H01L 33/24; H01L 33/32; H01L 33/58
USPC .......................................................... 257/98
See application file for complete search history.

(56) References Cited

U.S. PATENT DOCUMENTS

| | | |
|---|---|---|
| 8,247,887 B1 | 8/2012 | Raring et al. |
| 9,412,911 B2 * | 8/2016 | Atanackovic ........... H01L 22/24 |
| 10,108,079 B2 * | 10/2018 | Raring ................... H01S 5/4093 |
| 10,403,678 B2 | 9/2019 | Percival |
| 10,468,552 B2 | 11/2019 | Lutgen |
| 10,573,781 B1 | 2/2020 | Munkholm et al. |
| 10,593,834 B2 | 3/2020 | Wu et al. |
| 10,923,630 B1 | 2/2021 | Pynn et al. |

(Continued)

OTHER PUBLICATIONS

U.S. Office Action dated Jun. 16, 2020 in U.S. Appl. No. 16/415,769.

(Continued)

*Primary Examiner* — Tu-Tu V Ho
(74) *Attorney, Agent, or Firm* — Weaver Austin Villeneuve & Sampson LLP

(57) ABSTRACT

An optical system includes an optical waveguide, a micro light emitting diode (micro-LED) configured to emit at least partially polarized light, and a waveguide coupler configured to couple the at least partially polarized light from the micro-LED into the optical waveguide with a coupling efficiency higher than a coupling efficiency of the waveguide coupler for unpolarized light. The micro-LED includes a substrate including a hexagonal lattice and having a first surface parallel to a semi-polar plane of the hexagonal lattice, and a plurality of layers grown on the first surface. The plurality of layers includes an active layer that includes a III-nitride material and has a top surface parallel to the semi-polar plane and the first surface of the substrate, such that the light emitted by the micro-LED is at least partially polarized and can be more efficiently coupled into the optical waveguide.

20 Claims, 20 Drawing Sheets

(56) References Cited

U.S. PATENT DOCUMENTS

| | | |
|---|---|---|
| 2008/0179623 A1 | 7/2008 | Tachibana et al. |
| 2008/0230766 A1 | 9/2008 | Okamoto et al. |
| 2008/0232416 A1 | 9/2008 | Okamoto et al. |
| 2009/0166608 A1 | 7/2009 | Nakanishi et al. |
| 2009/0194761 A1 | 8/2009 | Masui et al. |
| 2009/0279278 A1 | 11/2009 | Tsujimura et al. |
| 2011/0073888 A1 | 3/2011 | Ueno et al. |
| 2011/0179993 A1 | 7/2011 | Inoue et al. |
| 2011/0216795 A1 | 9/2011 | Hsu et al. |
| 2011/0220866 A1 | 9/2011 | Xu et al. |
| 2012/0049156 A1 | 3/2012 | Ohta et al. |
| 2012/0058577 A1 | 3/2012 | Yoshida et al. |
| 2012/0113656 A1 | 5/2012 | Iwanaga et al. |
| 2012/0119218 A1 | 5/2012 | Su |
| 2012/0205620 A1 | 8/2012 | Sato et al. |
| 2012/0211725 A1 | 8/2012 | Yokogawa et al. |
| 2013/0001513 A1 | 1/2013 | Yokogawa et al. |
| 2013/0044782 A1 | 2/2013 | Raring |
| 2013/0049569 A1 | 2/2013 | Schubert et al. |
| 2013/0126900 A1 | 5/2013 | Inoue et al. |
| 2013/0146928 A1 | 6/2013 | Inoue et al. |
| 2013/0156060 A1 | 6/2013 | Futagawa et al. |
| 2013/0168733 A1 | 7/2013 | Iwanaga et al. |
| 2013/0175566 A1 | 7/2013 | Inoue et al. |
| 2013/0200391 A1 | 8/2013 | Bedair et al. |
| 2013/0207150 A1 | 8/2013 | Inoue et al. |
| 2013/0234110 A1 | 9/2013 | Kato et al. |
| 2013/0248877 A1 | 9/2013 | Fujikane et al. |
| 2014/0008613 A1 | 1/2014 | Sheu et al. |
| 2014/0014997 A1 | 1/2014 | Kato et al. |
| 2014/0048771 A1 | 2/2014 | Takahashi et al. |
| 2014/0065360 A1 | 3/2014 | D'evelyn et al. |
| 2014/0077223 A1 | 3/2014 | Choe et al. |
| 2014/0103292 A1 | 4/2014 | Yoshida et al. |
| 2014/0264372 A1 | 9/2014 | Fujikane et al. |
| 2014/0308769 A1 | 10/2014 | Farrell et al. |
| 2014/0332933 A1 | 11/2014 | Li et al. |
| 2014/0349427 A1 | 11/2014 | El-ghoroury et al. |
| 2014/0353679 A1 | 12/2014 | Seo et al. |
| 2015/0187991 A1 | 7/2015 | McGroddy et al. |
| 2015/0200286 A1 | 7/2015 | Liu et al. |
| 2015/0229108 A1 | 8/2015 | Steigerwald et al. |
| 2015/0236201 A1 | 8/2015 | Shepherd |
| 2015/0263223 A1 | 9/2015 | Ito et al. |
| 2015/0270440 A1 | 9/2015 | Kimura et al. |
| 2015/0311068 A1 | 10/2015 | Tsukada et al. |
| 2015/0325746 A1 | 11/2015 | Percival |
| 2015/0357521 A1 | 12/2015 | Choe |
| 2016/0013364 A1 | 1/2016 | Cha et al. |
| 2017/0069790 A1 | 3/2017 | Choi et al. |
| 2017/0170360 A1 | 6/2017 | Bour et al. |
| 2017/0236704 A1 | 8/2017 | Dasgupta et al. |
| 2017/0362739 A1 | 12/2017 | Kajimoto et al. |
| 2018/0047782 A1 | 2/2018 | Percival |
| 2018/0145164 A1 | 5/2018 | Dasgupta et al. |
| 2018/0156965 A1 | 6/2018 | El-ghoroury et al. |
| 2018/0158987 A1 | 6/2018 | Lee et al. |
| 2019/0305183 A1 | 10/2019 | Lutgen |
| 2020/0028029 A1 | 1/2020 | Avramescu et al. |
| 2020/0083400 A1 | 3/2020 | Henry et al. |
| 2020/0105968 A1 | 4/2020 | Lutgen |
| 2020/0168146 A1 | 5/2020 | Hughes et al. |
| 2020/0176634 A1 | 6/2020 | Batres et al. |
| 2020/0176637 A1 | 6/2020 | Wu et al. |
| 2020/0184884 A1 | 6/2020 | Lau et al. |
| 2020/0244036 A1 | 7/2020 | Forman et al. |

OTHER PUBLICATIONS

U.S. Appl. No. 16/415,769, filed May 17, 2019, Pynn et al.
Olivier et al., "Influence of size-reduction on the performances of GaN-based micro-LEDs for display application", Journal of Luminescence 191, 2017, 5 pages.
Browne et al., "Indium and impurity incorporation in InGaN films on polar, nonpolar, and semipolar GaN orientations grown by ammonia molecular beam epitaxy", J. Vac. Sci. Technol. A 30(4), American Vacuum Society, 2012, 8 pages.
Forman et al., "Semipolar (2021) III-Nitride P-Down LEDs with in situ anneal to reduce the Mg memory effect", Journal of Crystal Growth 464, 2017, 4 pages.
Romanov et al., "Basal plane misfit dislocations and stress relaxation in III-nitride semipolar heteroepitaxy", Journal of Applied Physics 109, 2011, 12 pages.
Zhao et al., "Valence band states and polarized optical emission from nonpolar and semipolar III-nitride quantum well optoelectronic devices", Japanese Journal of Applied Physics 53, 2014, 17 pages.
U.S. Final Office Action dated Dec. 30, 2020 in U.S. Appl. No. 16/415,769.
U.S. Advisory Action dated Mar. 9, 2021 in U.S. Appl. No. 16/415,769.
Fellows, et al., "Increased Polarization Ratio on Semipolar (1122) InGaN/GaN Light-Emitting Diodes with Increasing Indium Composition", Japanese Journal of Applied Physics, vol. 47, No. 10, 2008, pp. 7854-7856.
Koslow, et al., "Performance and polarization effects in (1122) long wavelength light emitting diodes grown on stress relaxed InGaN buffer layers", Applied Physics Letters 101, 121106 (2012), 4 pages.
Mounir, et al., "On the optical polarization properties of semipolar (2021) and (2021) InGaN/GaN quantum wells", Journal of Applied Physics 123, 085705 (2018), 11 pages.
Zhao, et al., "High optical polarization ratio from semipolar (2021) blue-green InGaN/GaN light-emitting diodes", Applied Physics Letters 99, 051109 (2011), 3 pages.
Zhao, et al., "Optical polarization characteristics of semipolar (3031) and (3031) InGaN/GaN light-emitting diodes", Optics Express A54, vol. 21, No. SI, Jan. 14, 2013, 7 pages.
Notice of Allowance dated Apr. 6, 2021, in U.S. Appl. No. 16/415,769.

\* cited by examiner

WAVEGUIDE IN-COUPLING USING POLARIZED LIGHT EMITTING DIODES

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, and wearable electronic devices. Micro-LEDs ("µLEDs") based on III-nitride semiconductors have begun to be developed for various display applications due to their small size, high packing density (and hence higher resolution), and high brightness. For example, micro-LEDs that emit light of different colors (e.g., red, green, and blue) can be used to display images in a waveguide-based near-eye display system.

A waveguide-based near-eye display system may display virtual objects and/or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or other waveguides. The display light for the computer-generated images may be generated using micro-LEDs and may be coupled into the waveguides, which may then guide the display light and deliver the display light to user's eyes. Micro-LEDs may also be used as the light sources for other optical systems that include planar or nonplanar optical waveguides, such as buried-channel waveguide, ridge waveguide, rib waveguide, and the like.

SUMMARY

This disclosure relates generally to improving the efficiency of an optical system that includes a micro-LED and an optical waveguide. More specifically, techniques disclosed herein relate to improving both the quantum efficiency and the degree of linear polarization of the emitted light of a micro-LED, such that both the light emission efficiency of the micro-LED and the light coupling efficiency from the micro-LED to the optical waveguide can be improved. According to some embodiments, a micro-LED device is fabricated on III-nitride layers that are epitaxially grown on a semi-polar plane (e.g., $(20\bar{2}1)$ plane), where the micro-LED device may have a high peak quantum efficiency and a low peak efficiency operating current, and may also emit highly polarized light that can be more efficiently coupled into a waveguide that accepts polarized light. As such, a display system that includes the micro-LED and a waveguide-based display can more efficiently convert electrical energy to display light and deliver the display light to user's eyes.

According to some embodiments, an optical system may include an optical waveguide, a micro light emitting diode configured to emit at least partially polarized light, and a waveguide coupler configured to couple the at least partially polarized light emitted from the micro light emitting diode into the optical waveguide with a coupling efficiency higher (e.g., up to about 50% higher or more) than a coupling efficiency of the waveguide coupler for unpolarized light. The micro light emitting diode may include a substrate including a hexagonal lattice and having a first surface parallel to a semi-polar plane of the hexagonal lattice, and a plurality of layers grown on the first surface of the substrate. The plurality of layers may include an active layer that includes a III-nitride material and has a top surface parallel to the semi-polar plane and the first surface of the substrate, such that the light emitted by the micro light emitting diode is at least partially polarized and can be more efficiently coupled into the optical waveguide. The waveguide coupler may include, for example, a lens, a micro-lens, a grating, or a prism.

In some embodiments of the optical system, the top surface of the active layer may be characterized by a linear dimension less than 20 µm. In some embodiments, an angle between the semi-polar plane and a c-plane of the hexagonal lattice may be between about 0° and about 90°. In some embodiments, the angle may be between about 45° and about 90°. In some embodiments, the semi-polar plane may include a $(20\bar{2}1)$ plane of the hexagonal lattice.

In some embodiments of the optical system, the at least partially polarized light is characterized by a degree of linear polarization greater than about 0.5. In some embodiments, the optical waveguide and the waveguide coupler are characterized by a polarization-dependent in-coupling efficiency. In some embodiments, a peak efficiency current density of the micro light emitting diode is less than 1 $A/cm^2$.

In some embodiments, the substrate may include GaN, GaAs, GaP, sapphire, silicon carbide, silicon, zinc oxide, boron nitride, lithium aluminate, lithium niobate, germanium, aluminum nitride, lithium gallate, partially substituted spinel, or quaternary tetragonal oxide having a beta-LiAlO$_2$ structure. In some embodiments, the active layer may include an InGaN multiple-quantum-well (MQW) or a single quantum well.

In some embodiments, the plurality of layers may form a mesa on the first surface of the substrate. The mesa may be characterization by a vertical, conical, semi-parabolic, or parabolic shape. In some embodiments, the micro light emitting diode may further include a passivation layer on one or more surfaces of the mesa. In some embodiments, the passivation layer may be configured to reflect the at least partially polarized light emitted by the micro light emitting diode. In some embodiments, the passivation layer is configured to collimate the at least partially polarized light emitted by the micro light emitting diode.

According to certain embodiments, a display device may include a micro light emitting diode (micro-LED) configured to emit at least partially polarized light, a waveguide display, a waveguide coupler configured to couple the at least partially polarized light from the micro-LED into the waveguide display such that the coupled light may be guided by the waveguide display to propagate in the waveguide display, and an output coupler coupled to the waveguide display and configured to couple the light propagating in the waveguide display out of the waveguide display. The micro-LED may include a substrate including a hexagonal lattice and having a first surface parallel to a semi-polar plane of the hexagonal lattice, and a plurality of layers grown on the first surface. The plurality of layers may include an active layer that includes a III-nitride material and has a top surface parallel to the semi-polar plane and the first surface of the substrate, such that the micro-LED may emit at least partially polarized light. The waveguide coupler may be characterized by a higher coupling efficiency for the at least partially polarized light than for unpolarized light so as to improve the coupling efficiency from the micro-LED to the waveguide display.

In certain embodiments of the display device, an angle between the semi-polar plane and a c-plane of the hexagonal lattice may be between about 45° and about 90°. For example, the semi-polar plane may include a (20$\bar{2}$1) plane of the hexagonal lattice. The at least partially polarized light emitted by the micro-LED may be characterized by a degree of linear polarization greater than 0.5.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
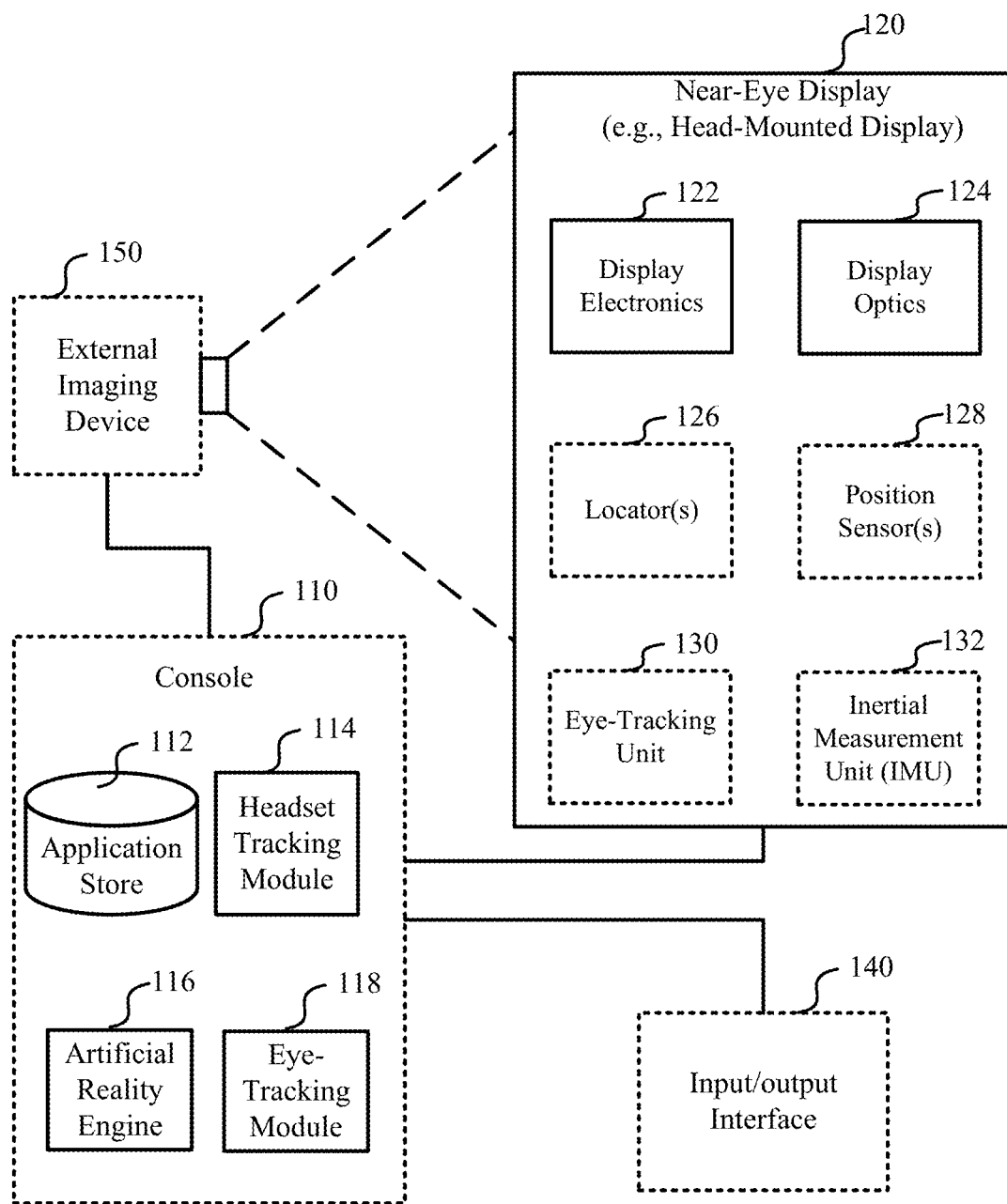
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to improving the efficiency of a system including a micro light emitting diode (micro-LED) coupled to an optical waveguide. More specifically, techniques disclosed herein relate to improving both the quantum efficiency and the degree of linear polarization of the emitted light of a micro-LED, such that both the light emission efficiency of the micro-LED and the light coupling efficiency from the micro-LED to the optical waveguide (and thus the overall efficiency of the system) can be improved. In some embodiments, a micro-LED device for a display system is fabricated on III-nitride (e.g., AlN, GaN, or InN) layers that are epitaxially grown on certain semi-polar planes (e.g., (20$\bar{2}$1) plane), where the micro-LED device may achieve a high peak quantum efficiency and a low peak efficiency operating current, and may also emit highly polarized light that can be more efficiently coupled into a waveguide. As such, the display system that includes the micro-LED and the waveguide can have a high overall efficiency for converting electrical energy to display light and delivering the display light to user's eyes. Various inventive embodiments, including devices, systems, methods, materials, and the like, are described herein.

The overall efficiency of a waveguide-based display system may be the product of the efficiency of individual components in the display system and may also depend on how the components are coupled together. In a simplified example, the overall efficiency $\eta_{tot}$ of a waveguide-based display system may be determined as $\eta_{tot}=\eta_{EQE}\times\eta_{in}\times\eta_{out}$, where $\eta_{EQE}$ is the external quantum efficiency of a micro-LED, $\eta_{in}$ is the in-coupling efficiency of display light from the micro-LED into the waveguide, and $\eta_{out}$ is the out-coupling efficiency of the display light from the waveguide towards the user's eye. Thus, the overall efficiency $\eta_{tot}$ can be improved by improving one or more of $\eta_{EQE}$, $\eta_{in}$, and $\eta_{out}$.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The coupling efficiency from a light source to a waveguide is generally polarization dependent, and thus can be improved by generating polarized light that can be coupled into a waveguide with a high coupling efficiency. In c-plane LED devices, the emitted light is unpolarized because the quantum well undergoes equibiaxial stress and thus the top two valence bands (e.g., heavy-hole and light-hole bands) are equally mixed. Polarized light can be generated, for example, by filtering unpolarized light from an unpolarized light source using a polarization filter, such as a linear polarizer. However, about a half of the emitted unpolarized light may be filtered out (e.g., blocked) by the polarization filter.

According to certain embodiments, micro-LEDs fabricated on III-nitride materials having certain crystal orientations can achieve a better efficiency performance than micro-LED devices fabricated on III-nitride materials with conventional (e.g., c-plane) orientations. More specifically, for micro-LEDs fabricated on III-nitride materials with certain semi-polar orientations (between the polar c-plane and nonpolar a- or m-plane), the (peak) quantum efficiency of the micro-LEDs does not drop with decreasing micro-LED size, and the current density at the peak quantum efficiency does not increase with decreasing micro-LED size. For example, a sustained peak quantum efficiency and a sustained low peak efficiency current density can be achieved for micro-LEDs fabricated on GaN epitaxial layers grown on the (20$\bar{2}$1) plane, even if the micro-LED size decreases to a size comparable to the minority carrier diffusion length, such as a few micrometers.

In addition, the polarization state of III-nitride LEDs may depend on the dipole orientation of the light-emitting electron-hole transitions, where polarized light can be emitted due to the anisotropic biaxial strain in the quantum-well light emitting layers. In LEDs fabricated on GaN layers having semi-polar (or nonpolar) orientations, the GaN layers naturally undergo anisotropic strain and thus can emit light with a higher degree of linear polarization because the top two valence bands are unequally mixed. Using micro-LEDs that generate light with a higher degree of linear polarization, an in-coupling efficiency can be improved by more than 50% compared to the case with completely unpolarized light (e.g., light with a degree of linear polarization about 0%).

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, or even 2 µm. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "degree of linear polarization" or "polarization ratio" of a light beam refers to the ratio between the difference between the optical powers of the light beam in two orthogonal polarization directions and the sum of the optical powers of the light beam in the two orthogonal polarization directions, and can be determined according to $\rho=|I_1-I_2|/(I_1+I_2)$, where $I_1$ and $I_2$ are the optical powers of the light beam in two orthogonal polarization directions.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140 that may each be coupled to an optional console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audios may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
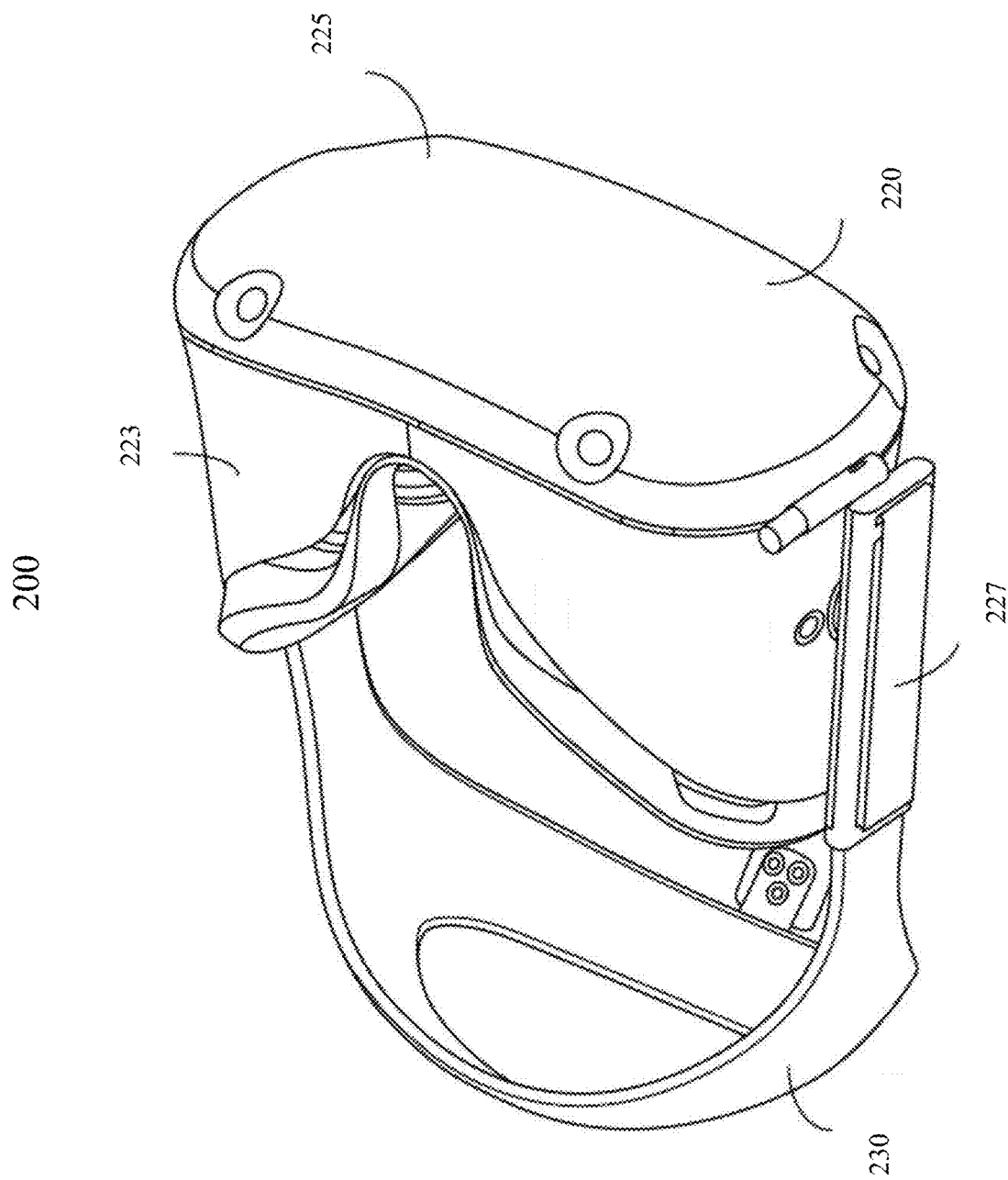
FIG. 2 is a perspective view of an example of a near-eye display in the form of a head-mounted display (HMD) device for implementing some of the examples disclosed herein.

FIG. 2 is a perspective view of an example of a near-eye display in the form of a head-mounted display (HMD) device 200 for implementing some of the examples disclosed herein. HMD device 200 may be a part of, e.g., a virtual reality (VR) system, an augmented reality (AR) system, a mixed reality (MR) system, or some combinations thereof. HMD device 200 may include a body 220 and a head strap 230. FIG. 2 shows a top side 223, a front side 225, and a right side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temples tips as shown in, for example, FIG. 2, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audios, or some combinations thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro light emitting diode (µLED) display, an active-matrix organic light emitting diode (AMOLED) display, a transparent organic light emitting diode (TOLED) display, some other display, or some combinations thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or some combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
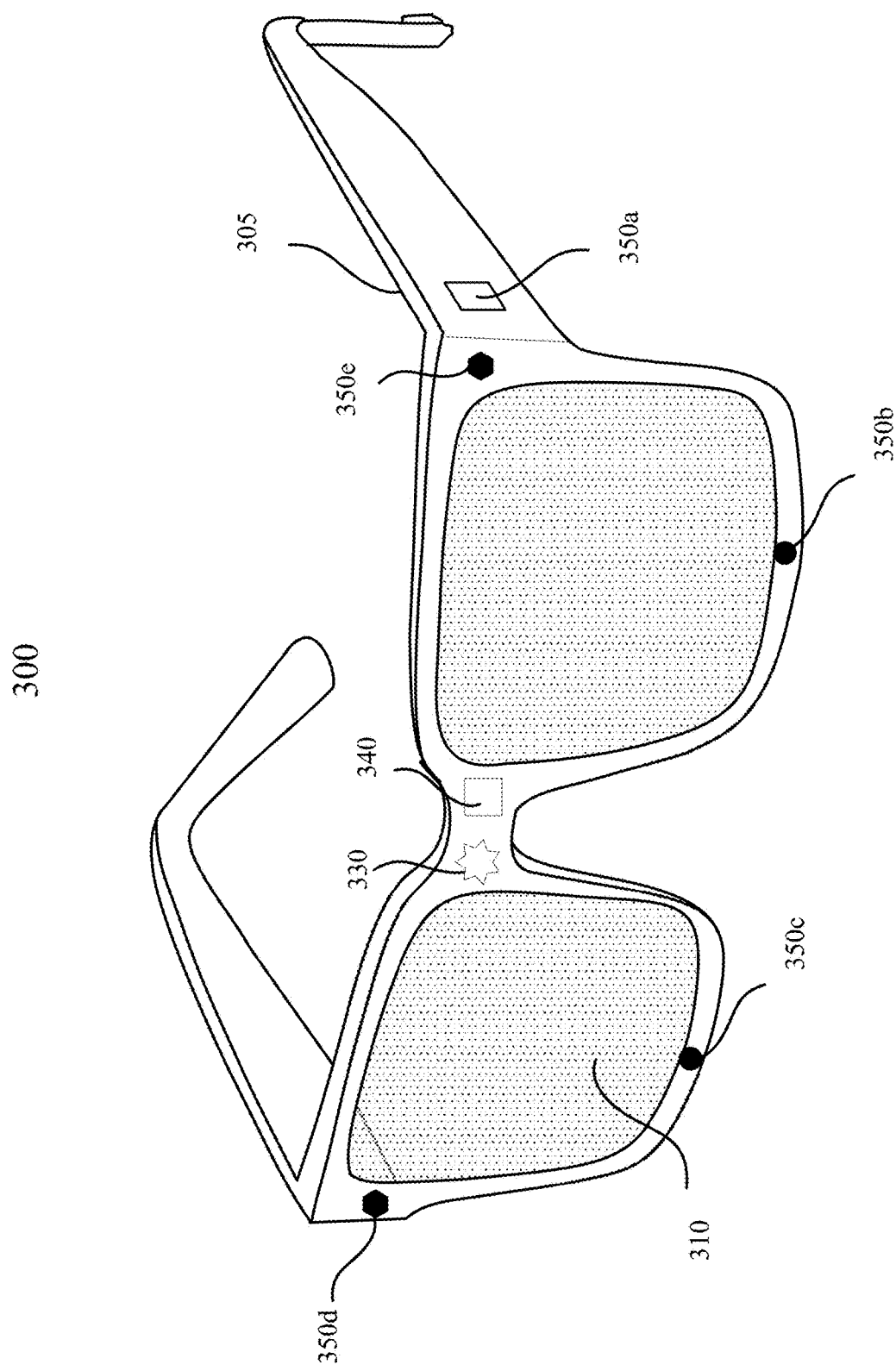
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350*a*, 350*b*, 350*c*, 350*d*, and 350*e* on or within frame 305. In some embodiments, sensors 350*a*-350*e* may include one or more depth sensors, motion sensors, position sensors, inertial sensors, or ambient light sensors. In some embodiments, sensors 350*a*-350*e* may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
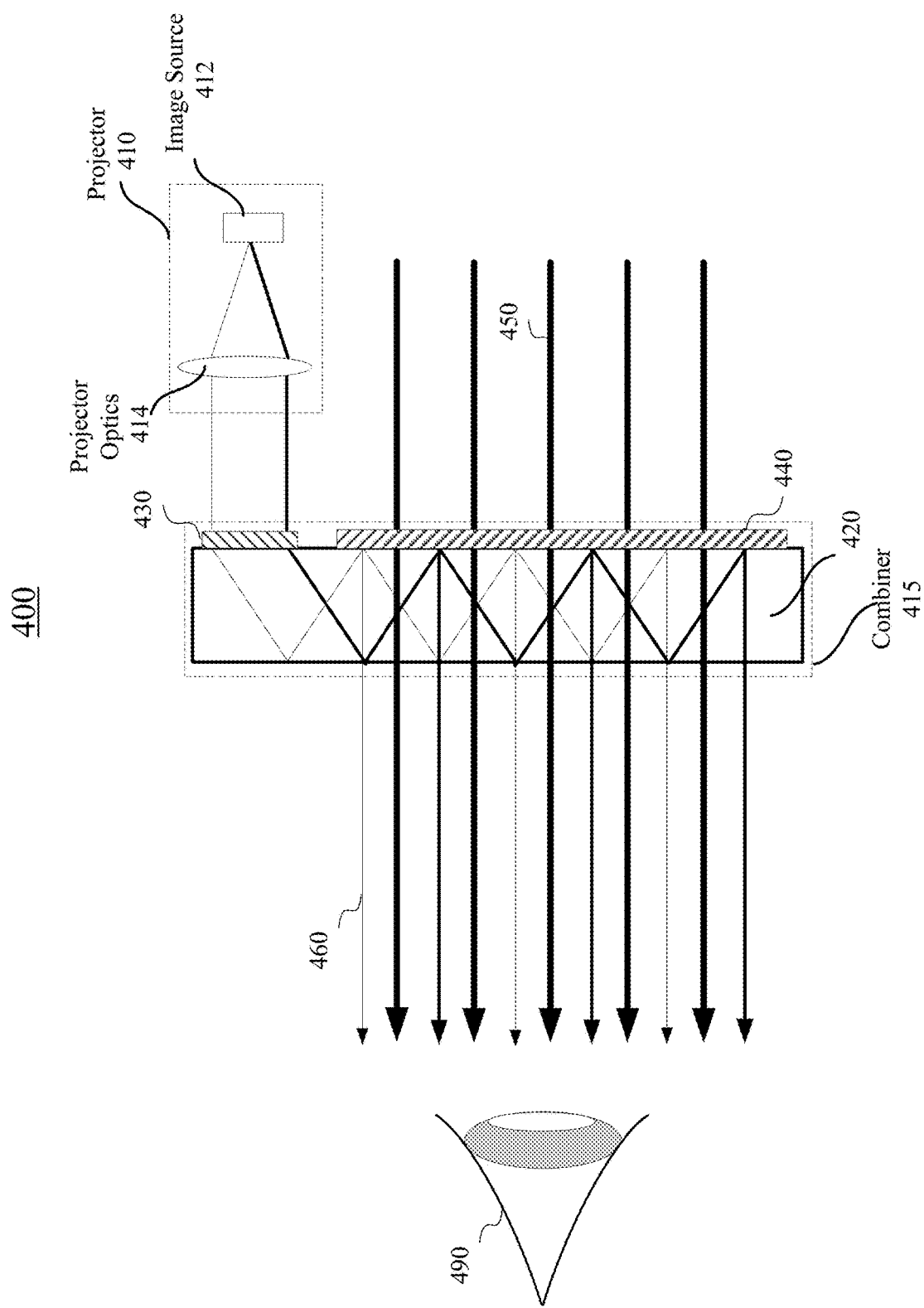
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, and/or a light emitting diode. In some embodiments, image source 412 may include a plurality of light sources each emitting a monochromatic image light corresponding to a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Input coupler 430 may include a volume holographic grating, a diffractive optical elements (DOE) (e.g., a surface-relief grating), a slanted surface of substrate 420, or a refractive coupler (e.g., a wedge or a prism). Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440 configured to extract at least a portion of the light guided by and propagating within substrate 420 from substrate 420, and direct extracted light 460 to an eye 490 of the user of augmented reality system 400. As input coupler 430, output couplers 440 may include grating couplers (e.g., volume holographic gratings or surface-relief gratings), other DOEs, prisms, etc. Output couplers 440 may have different coupling (e.g., diffraction) efficiencies at different locations. Substrate 420 may also allow light 450 from environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and virtual objects projected by projector 410.

As described above, the overall efficiency of a photonic integrated circuit or a waveguide-based display (e.g., in augmented reality system 400) may be a product of the efficiency of individual components and may also depend on how the components are connected. For example, the overall efficiency $\eta_{tot}$ of the waveguide-based display in augmented reality system 400 may depend on the light emitting efficiency of image source 412, the light coupling efficiency from image source 412 into combiner 415 by projector optics 414 and input coupler 430, and the output coupling efficiency of output coupler 440, and thus may be determined as:

$$\eta_{tot} = \eta_{EQE} \times \eta_{in} \times \eta_{out}, \tag{1}$$

where $\eta_{EQE}$ is the external quantum efficiency (EQE) of image source 412, $\eta_{in}$ is the in-coupling efficiency of light from image source 412 into the waveguide (e.g., substrate 420), and $\eta_{out}$ is the outcoupling efficiency of light from the waveguide towards the user's eye by output coupler 440. Thus, the overall efficiency $\eta_{tot}$ of the waveguide-based display can be improved by improving one or more of $\eta_{EQE}$, $\eta_{in}$, and $\eta_{out}$.

The light sources, image sources, or other displays described above may include one or more LEDs. For example, each pixel in a display may include three subpixels that include a red micro-LED, a green micro-LED, and a blue micro-LED. A semiconductor light emitting diode generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active layer that may include hetero-structures (e.g., one or more quantum wells), and a p-type material layer. The multiple layers of semiconductor materials may be grown on a surface of a substrate having a certain orientation. Photons can be generated in a semiconductor LED (e.g., a micro-LED) at a certain internal quantum efficiency (IQE) through the recombination of electrons and holes within an active region (e.g., one or more semiconductor layers). The generated photons are then extracted from the LEDs in a particular direction or within a particular solid angle.

As described above, the external quantum efficiency of an LED describes how efficiently the LED converts injected electrons to photons that are extracted from the device, and can be calculated as the ratio between the number of emitted photons extracted from the LED and the number of electrons passing through the LED. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. In some embodiments, to increase the light extraction efficiency, a mesa that includes at least some of the layers of semiconductor materials may be formed.

The internal quantum efficiency of III-nitride (e.g., GaN) LEDs depends on the relative rates of competitive radiative (light producing) recombination and non-radiative (lossy) recombination that occur in the active region of the LEDs. Non-radiative recombination processes in the active region include Shockley-Read-Hall (SRH) recombination at defect sites and eeh/ehh Auger recombination, which is a non-radiative process involving three carriers. In micro-LEDs, as the size of an LED is reduced and becomes comparable to the minority carrier diffusion length, a larger proportion of the active region is close to the LED sidewall surface where the defect density may be high, and thus more injected carriers may be subjected to a higher SRH recombination rate. This may cause the peak efficiency of the LED to decrease or cause the peak efficiency operating current to increase. Increasing the current injection may cause the efficiencies of the micro-LEDs to drop due to the higher Auger recombination rate at a higher current density. In addition, LEDs including heterostructures (e.g., quantum wells) formed using III-nitride materials may have a strong internal strain-induced piezoelectric field in the carrier transport direction. The strain-induced internal field may cause the electron and hole energy levels to shift (thus changing the bandgap and emission wavelength) and cause the electrons and holes to shift to opposite sides of a quantum well (i.e., decreasing the spatial electron-hole overlap), thus reducing the recombination efficiency of the LEDs.

The optical coupler that couples the emitted light from a light source to a waveguide may include, for example, a grating, a lens, a micro-lens, a prism. In some embodiments, light from a small light source (e.g., a micro-LED) can be directly (e.g., end-to-end) coupled from the light source to a waveguide, without using an optical coupler. In some embodiments, the optical coupler (e.g., a lens or a parabolic-shaped reflector) may be manufactured on the light source. The coupling efficiency from the light source to the waveguide are generally polarization dependent, for example, due to the structure and the guided modes of the waveguide or the polarization dependency of some optical couplers. Thus, the coupling efficiency can be improved by generating polarized light that can be coupled into a waveguide with the highest coupling efficiency.

Polarized light can be generated, for example, by filtering unpolarized light from an unpolarized light source using a polarization filter (e.g., a linear polarizer), but a half of the emitted unpolarized light may be filtered out (e.g., blocked) by the polarization filter. In c-plane LED devices, the emitted light is unpolarized because the quantum well undergoes equibiaxial stress and thus the top two valence bands (e.g., heavy-hole and light-hole bands) are equally mixed. To polarize the emission from c-plane LED devices, a monolithic grating may be used to selectively extract light of a single polarization state (e.g., polarization direction). To improve the light emitting efficiency of the c-plane LED devices, light of other polarization states may need to be recycled, which may be difficult and/or inefficient. Alternatively, highly polarized light can be emitted by quantum-well emitting layers with high anisotropic biaxial strain, where the top two valence bands can be unequally mixed when the quantum wells are subjected to anisotropic in-plane strain, such as by nano-patterning to preferentially release strain in a single in-plane direction, which can be difficult or expensive to achieve.

According to certain embodiments, LEDs can be fabricated on GaN layers having semi-polar (or nonpolar) orientations, where the GaN layers may naturally undergo anisotropic in-plane strain to unequally mix the top two valence bands and emit highly polarized light. Using micro-LEDs that generate light with a high degree of linear polarization, an in-coupling efficiency improvement (average for red, green, and blue light) greater than 50% can be achieved for coupling light into low-index waveguides, such as imprinted waveguides.

In addition, micro-LEDs fabricated on III-nitride materials (e.g., GaN) having certain crystal orientations can achieve a better quantum efficiency performance than micro-LED devices fabricated on III-nitride materials with conventional (e.g., c-plane) orientations, due to, for example, reduced SRH recombination rate and reduced internal strain-induced piezoelectric field in the carrier transport direction. More specifically, for micro-LEDs fabricated on III-nitride materials with certain semi-polar orientations (between the polar c-plane and nonpolar a- and en-planes), such as semi-polar planes that are at angles between 0° and 90° (i.e., a majority-N plane, e.g., between about 45° and about 90° or between about 60° and about 90°, such as 75°) with respect to the c-plane, the (peak) quantum efficiency of the micro-LEDs does not drop with decreasing micro-LED size, and the current density at the peak quantum efficiency does not increase with decreasing micro-LED size. For example, the peak quantum efficiency of micro-LEDs fabricated on GaN epitaxial layers grown on $(20\bar{2}1)$ plane does not drop with decreasing micro-LED size. Experimental results show that using GaN epitaxial layers having certain semi-polar orientations (e.g., $(20\bar{2}1)$ plane) can result in a sustained peak quantum efficiency and a sustained low (~1 A/cm$^2$) peak efficiency current density as the micro-LED size decreases.

Therefore, for micro-LEDs fabricated on III-nitride materials with certain semi-polar orientations, both a high external quantum efficiency $\eta_{EQE}$ and a high degree of linear polarization in the emitted light (and thus a higher coupling efficiency $\eta_{in}$ to a waveguide) can be achieved. As such, the overall efficiency of the system that includes the micro-LED or waveguide can be improved significantly.

Figure 5A:
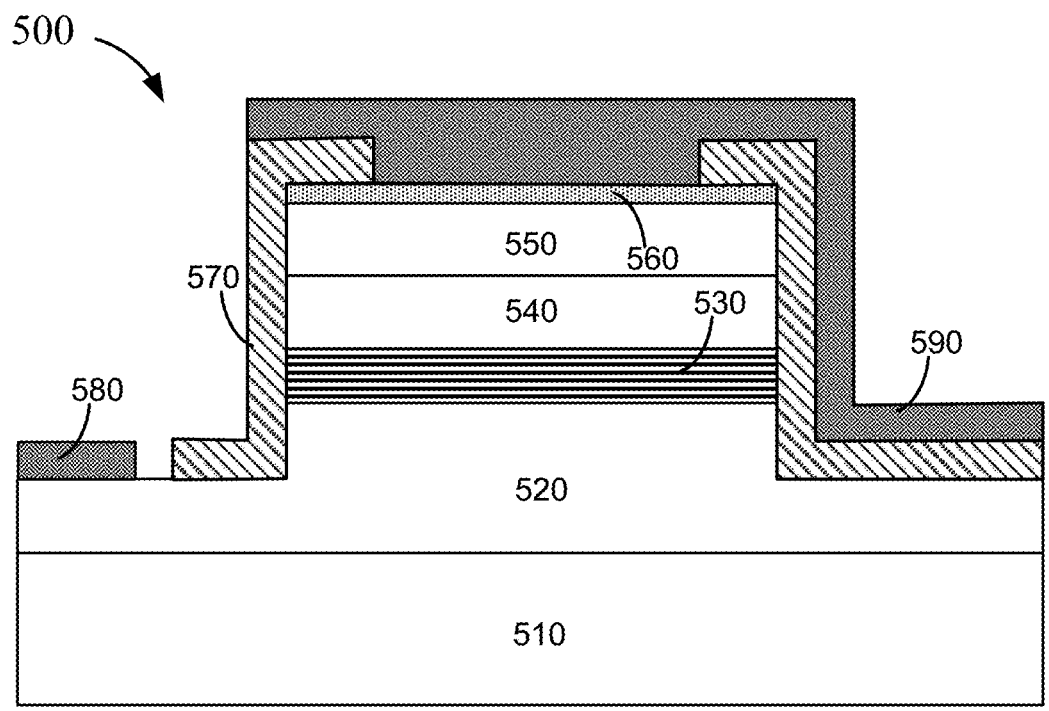
FIG. 5A illustrates an example of a light emitting diode (LED) including a vertical mesa structure according to certain embodiments.

FIG. 5A illustrates an example of a light emitting diode 500 including a vertical mesa structure. LED 500 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques, such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation, such as a GaN, GaAs, or GaP substrate, or a foreign substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 5A, LED 500 may include a substrate 510, which may include, for example, a sapphire substrate or a GaN substrate. A semiconductor layer 520 may be grown on substrate 510. Semiconductor layer 520 may include a III-V material, such as GaN, and may be p-doped (e.g., with Mg, Ca, Zn, or Be) or n-doped (e.g., with Si or Ge). One or more active layers 530 may be grown on semiconductor layer 520. Active layers 530 may include one or more InGaN layers, one or more AlInGaP layers, or one or more GaN layers, which may form one or more heterostructures, such as one or more quantum wells. A semiconductor layer 540 may be grown on active layers 530. Semiconductor layer 540 may include a III-V material, such as GaN, and may be p-doped (e.g., with Mg, Ca, Zn, or Be) or n-doped (e.g., with Si or Ge). One of semiconductor layer 520 and semiconductor layer 540 may be a p-type layer and the other one may be an n-type layer. Semiconductor layer 520 and semiconductor layer 540 sandwich active layers 530 to form the light emitting diode. For example, LED 500 may include a layer of InGaN situated between a layer of p-type GaN doped with magnesium and a layer of n-type GaN doped with silicon or oxygen. In some embodiments, LED 500 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 5A) may be grown to form a layer between active layers 530 and at least one of semiconductor layer 520 or semiconductor layer 540. The EBL may reduce the electron leakage current and improve the efficiency of the LED. In some embodiments, a heavily-doped semiconductor layer 550, such as a P$^+$ or P$^{++}$ semiconductor layer, may be formed on semiconductor layer 540 and act as a contact layer for forming an ohmic contact and reducing the contact impedance of the device. In some embodiments, a conductive layer 560 may be formed on heavily-doped semiconductor layer 550. Conductive layer 560 may include, for example, an indium tin oxide (ITO) or Al/Ni/Au film. In one example, conductive layer 560 may include a transparent ITO layer.

To make contact with semiconductor layer 520 (e.g., an n-GaN layer) of the diode and to more efficiently extract light emitted by active layers 530 from LED 500, the semiconductor material layers may be etched to expose semiconductor layer 520 and to form a mesa structure that includes layers 520-560. The mesa structure may confine carriers within the injection area of the device. Etching the mesa structure may lead to the formation of mesa sidewalls that may be orthogonal to the growth planes. A passivation layer 570 may be formed on the sidewalls of the mesa structure. Passivation layer 570 may include an oxide layer, such as a SiO$_2$ layer, and may act as a reflector to reflect emitted light out of LED 500. A contact layer 580, which may include a metal layer, such as Al, Au, Ni, Ti, or any combination thereof, may be formed on semiconductor layer 520 and may act as an electrode of LED 500. In addition, another contact layer 590, such as an Al/Ni/Au metal layer, may be formed on conductive layer 560 to act as another electrode of LED 500.

When a voltage signal is applied to contact layers 580 and 590, electrons and holes may recombine in active layers 530, where the recombination of electrons and holes may cause photon emission. The wavelength and energy of the emitted photons may depend on the energy bandgap between the valence band and the conduction band in active layers 530. For example, InGaN active layers may emit green or blue light, while AlInGaP active layers may emit red, orange, yellow, or green light. The emitted photons may be reflected by passivation layer 570 and may exit LED 500 from the top (e.g., the transparent ITO layer and thin contact layer) or bottom (e.g., substrate 510).

In some embodiments, LED 500 may include one or more other components, such as a lens, on the light emission surface, such as substrate 510, to focus or collimate the emitted light or couple the emitted light into a waveguide. In some embodiments, an LED may include a mesa of another shape, such as a planar, vertical, conical, semi-parabolic, or parabolic shape, where a base area of the mesa may be circular, rectangular, hexagonal, or triangular. For example, the LED may include a mesa of a curved shape (e.g., paraboloid shape) and non-curved shape (e.g., conic shape). The mesa may be truncated or non-truncated.

Figure 5B:
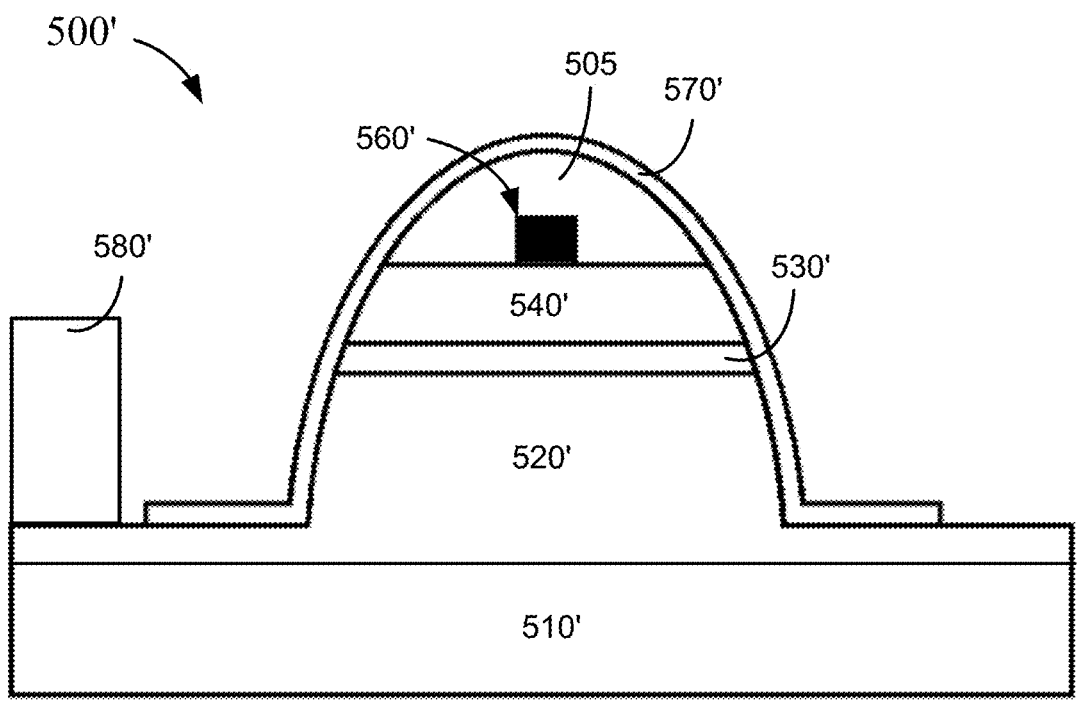
FIG. 5B is a cross-sectional view of an example of a light emitting diode including a parabolic mesa structure according to certain embodiments.

FIG. 5B is a cross-sectional view of an example of a light emitting diode 500' including a parabolic mesa structure. As LED 500, LED 500' may include multiple layers of semiconductor materials, such as multiple layers of III-V semiconductor materials. The semiconductor material layers may be epitaxially grown on a substrate 510', such as a GaN substrate or a sapphire substrate. For example, a semiconductor layer 520' may be grown on substrate 510'. Semiconductor layer 520' may include a III-V material, such as GaN, and may be p-doped (e.g., with Mg, Ca, Zn, or Be) or n-doped (e.g., with Si or Ge). One or more active layers 530' may be grown on semiconductor layer 520'. Active layers 530' may include one or more InGaN layers, one or more AlInGaP layers, or one or more GaN layers, which may form one or more heterostructures, such as one or more quantum wells. A semiconductor layer 540' may be grown on active layers 530'. Semiconductor layer 540' may include a III-V material, such as GaN, and may be p-doped (e.g., with Mg, Ca, Zn, or Be) or n-doped (e.g., with Si or Ge). One of semiconductor layer 520' and semiconductor layer 540' may be a p-type layer and the other one may be an n-type layer.

As shown on FIG. 5B, LED 500' may include a mesa that includes a dome top composed of a substantially transparent material 505, such as an oxide or a silicon compound (e.g., silicon oxide (SiOx) or silicon nitride (SiNx)). In some embodiments, transparent material 505 may include a material having a refractive index similar to that of semiconductor layer 540'. A reflector 570' may be formed on top of transparent material 505. In some embodiments, reflector 570' may include multiple layers of dielectric materials. In some embodiments, reflector 570' may include a metal layer, such as a layer of aluminum (Al) or silver (Ag). Reflector 570' may reflect light emitted in active layers 530' toward substrate 510'. In some embodiments, reflector 570' may be parabolic-shaped to act as a parabolic reflector.

Electrical contact 560' and electrical contact 580' may be formed on semiconductor layer 540' and semiconductor layer 520', respectively. Electrical contact 560' and electrical contact 580' may each include a conductive material, such as Al, Au, Ni, Ti, or any combination thereof, and may act as the electrodes of LED 500'. When a voltage signal is applied across electrical contacts 560' and 580', electrons and holes in active layers 530' may recombine, where the recombination of electrons and holes may be accompanied by photon emission. The emitted photons may propagate in many different directions, and may be reflected by reflector 570' towards substrate 510' and exit LED 500'. One or more other optical components, such as a lens, may be formed on the light emission surface, such as substrate 510', to focus or collimate the emitted light or couple the emitted light into a waveguide.

As described above, the external quantum efficiency of an LED may be proportional to the injection efficiency, the internal quantum efficiency, and the extraction efficiency. For micro-LEDs with small die size, as the size of the LEDs decreases, the peak efficiency of the LEDs may generally decrease and/or the peak efficiency operating current density may increase. Various approaches may be used to improve the overall efficiency of an LED, such as optimizing the doping level or using the mesa structure to confine the carriers in the active region to increase the injection efficiency, and using reflective layer (e.g., passivation layer 470 or reflector 470') on the sidewalls or the dome of the mesa structure to direct the light out of the LED to increase the extraction efficiency.

The internal quantum efficiency (IQE) of LEDs, such as III-nitride (e.g., GaN) LEDs, depends on the relative rates of competitive radiative (light producing) recombination and non-radiative (lossy) recombination that occur in the active region of the device. Although LEDs may achieve a high peak IQE under a lower injection current, their efficiencies may start to drop with increasing current injection, which may be referred to as efficiency droop. Non-radiative recombination processes in the active region include Shockley-Read-Hall (SRH) recombination at defect sites and eeh or ehh Auger recombination, which may be a major cause of efficiency droop. The internal quantum efficiency of an LED may be determined by:

$$IQE = \frac{BN^2}{AN + BN^2 + CN^3}, \qquad (2)$$

where A, B and C are the rates of SRH recombination, bimolecular (radiative) recombination, and Auger recombination, respectively, and N is the charge-carrier density (i.e., charge-carrier concentration) in the active region.

Figure 6:
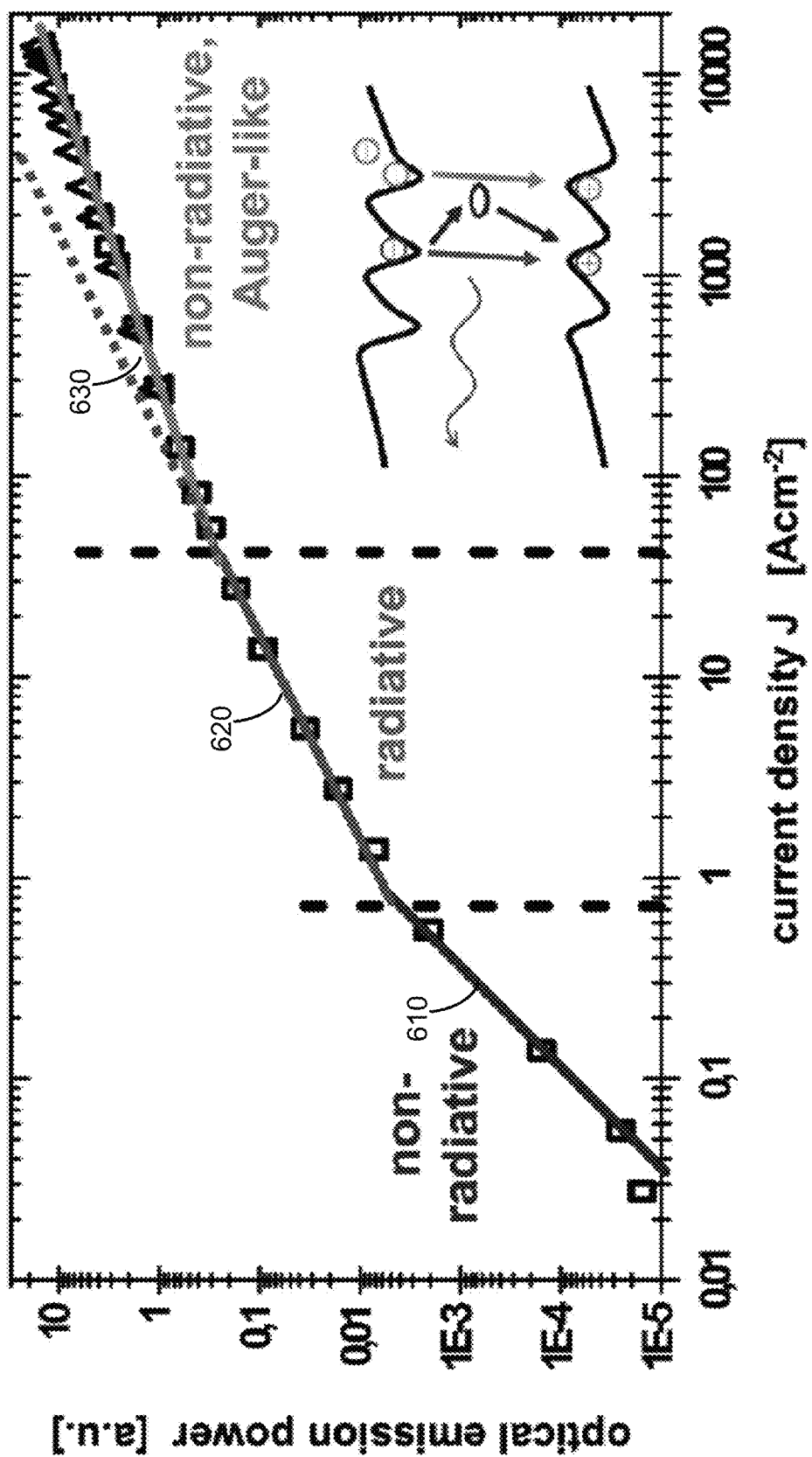
FIG. 6 illustrates the relationship between the optical emission power and the current density of a light emitting diode.

FIG. 6 illustrates the relationship between the optical emission power and the current density of a light emitting diode. As illustrated by a curve 610 in FIG. 6, the optical emission power of a micro-LED device may be low when the current density (and thus the charge carrier density N) is low, where the low external quantum efficiency may be caused by the relatively high non-radiative SRH recombination when the charge carrier density N is low according to equation (2). As the current density (and thus the charge carrier density N) increases, the optical emission power may increase as shown by a curve 620 in FIG. 6, because the radiative recombination may increase at a higher rate ($\propto N^2$) than the non-radiative SRH recombination ($\propto N$) when the charge carrier density N is high according to equation (2). As the current density increases further, the optical emission power may increase at a slower rate as shown by a curve 630 in FIG. 6 and thus the external quantum efficiency may drop because, for example, the non-radiative Auger recombination may increase at a higher rate ($\propto N^3$) than the radiative recombination ($\propto N^2$) when the charge carrier density N is sufficiently high according to equation (2).

Auger recombination is a non-radiative process involving three carriers. Auger recombination may be a major cause of efficiency droop and may be direct or indirect. For example, direct Auger recombination occurs when an electron and a hole recombine, but instead of producing light, either an electron is raised higher into the conduction band or a hole is pushed deeper into the valence band. Auger recombination may be reduced to mitigate the efficiency droop by lowering the charge-carrier density N in the active region for a given injection current density J, which may be written as:

$$J = q d_{eff}(AN + BN^2 + CN^3), \qquad (3)$$

where $d_{eff}$ is the effective thickness of the active region. Thus, according to equation (2), the effect of the Auger recombination may be reduced and thus the IQE of the LED may be improved by reducing the charge-carrier density N for a given injection current density, which may be achieved by increasing the effective thickness of the active region $d_{eff}$. The effective thickness of the active region may be increased by, for example, growing multiple quantum wells (MQWs). Alternatively, an active region including a single thick double heterostructure (DH) may be used to increase the effective thickness of the active region.

One factor affecting the effective thickness of the active region is the presence of internal fields $E_{qw}$ (e.g., strain-induced internal field) in the quantum wells. Internal fields $E_{qw}$ may localize charge carriers and reduces the overlap integral between carrier wave functions, which may reduce the radiative efficiency of LEDs. Some LEDs including heterostructures (e.g., quantum wells) formed using III-nitride materials may have a strong internal strain-induced piezoelectric field in the carrier transport direction. The strain-induced internal field may cause the electron and hole energy levels to shift (thus changing the bandgap) and cause the electrons and holes to shift to opposite sides of a quantum well, thus decreasing the spatial electron-hole overlap and reducing the radiative recombination efficiency and thus the internal quantum efficiency of the LED.

Figure 7B:
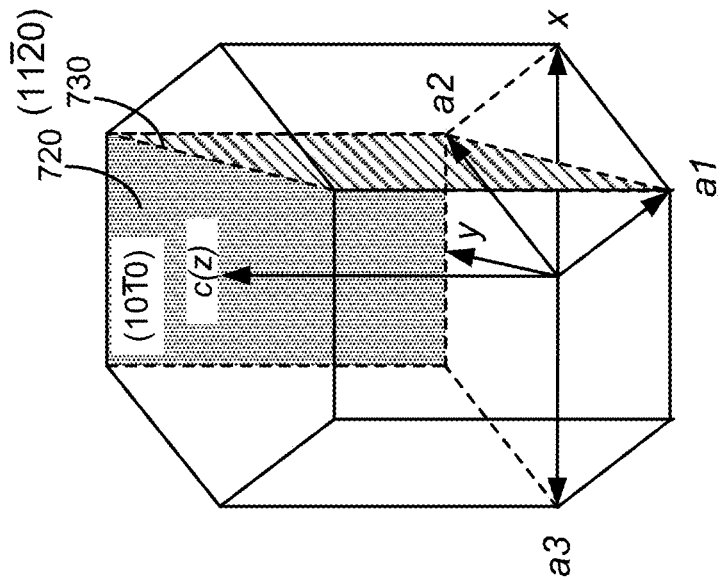
FIGS. 7A and 7B illustrate the hexagonal crystal lattice structure of an example of a III-nitride semiconductor material.
Figure 7A:
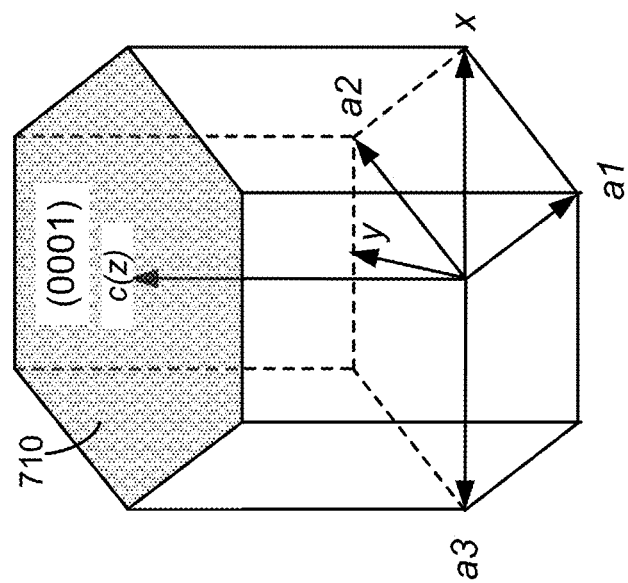

FIGS. 7A and 7B illustrate the hexagonal crystal lattice structure of an example of a III-nitride semiconductor material 700. Semiconductor material 700 may include, for example, a sapphire substrate or a GaN substrate that has a Wurtzite hexagonal lattice including a 7-fold rotation and 2 mirror planes as shown in the figures. The planes of a hexagonal lattice can be represented by four Miller-Bravais indices a1, a2, a3, and c as (a1, a2, a3, c), where a1+a2+a3=0. For example, a1+a2+a3=0 and c≠0 defines a sets of parallel planes (e.g., c-planes 710) that has different index c along the c-axis, which are polar planes that have the maximum spontaneous polarization in the direction perpendicular to the planes as a result of unequal numbers of nitride atoms and gallium atoms in the double monolayer. An example of a c-plane 710 is shown in FIG. 7A. When index c of a plane is nonzero, and any of the a1 and a2 indices of the plane is nonzero, the plane is a semi-polar plane. If index c of a plane is 0, the plane is featured by a zero polarization field in the direction perpendicular to the plane and is thus referred to as a "nonpolar" plane. An example of a nonpolar m-plane 720 is shown in FIG. 7B.

In polar crystals, such as GaN, the spontaneous polarization in the growth direction is at the maximum for crystals grown on the c-plane (i.e., polar plane). The polarization may change directions for crystals grown on planes of other orientations. Thus, the polarization in the growth direction may decrease for crystals grown on planes that make angles $0°<\theta<90°$ with the c-plane (i.e., the semi-polar planes), and may become zero (nonpolar) for crystals grown on planes perpendicular to the polar plane (i.e., the nonpolar planes). Piezoelectric polarization in InGaN/GaN structures may behave in a similar manner, and thus the piezoelectric polarization may also differ for planes with different orientations. Thus, heterostructures (e.g., quantum wells) based on these polar crystals may have a strong internal electric field induced by the piezo- and spontaneous polarization along the most natural crystal growth direction [0001] (i.e., the c-axis). As such, carriers in heterostructures grown on the c-plane may experience a strong polarization-induced internal field in their transport direction (e.g., the heterostructure growth direction). The polarization-induced internal fields in the carrier transport direction may cause a shift of the exciton emission energy inside these heterostructures, where electrons and holes may also be shifted to opposite sides of the well and confined by the well.

Figures 8A, 8B:
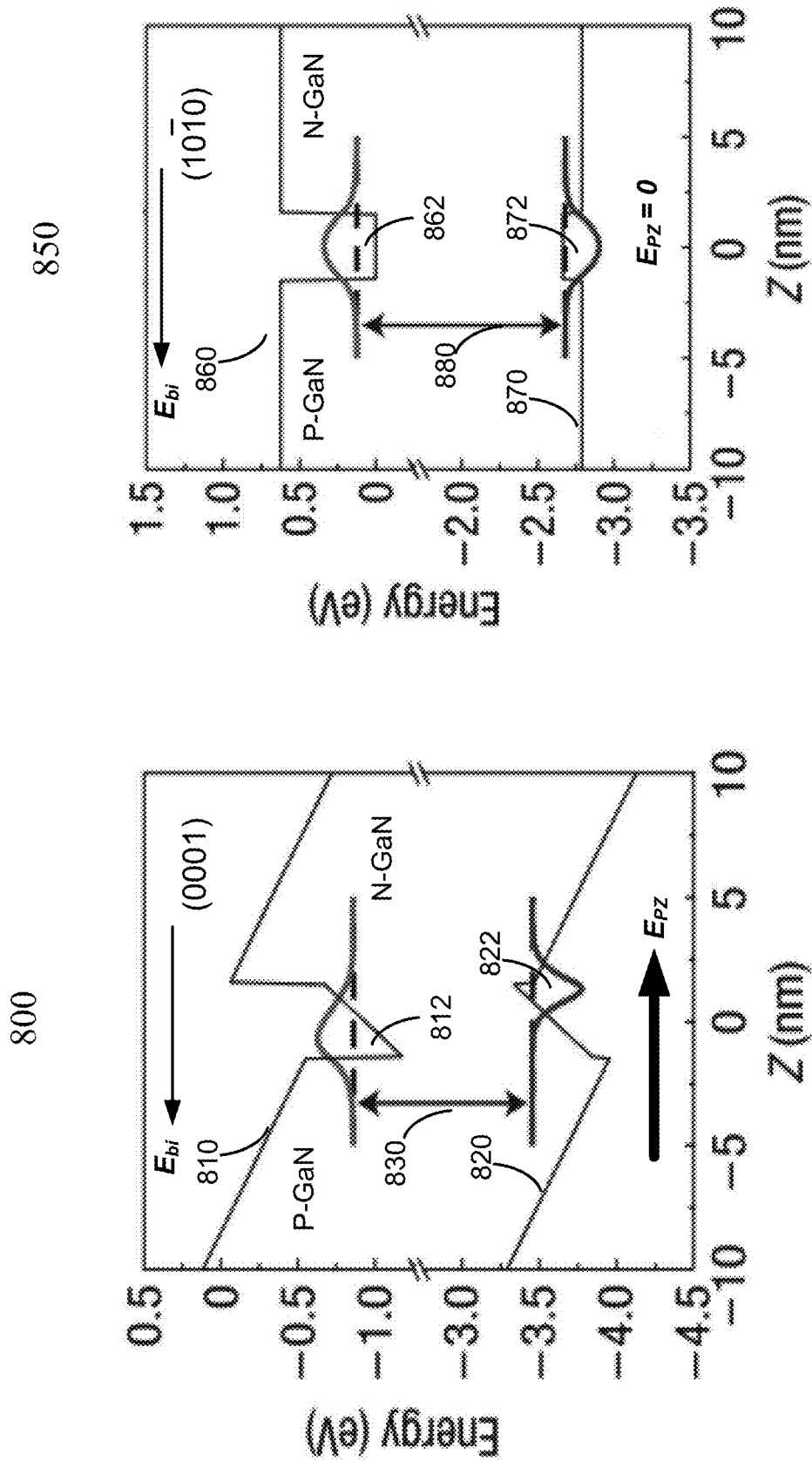
FIG. 8A illustrates energy bands of an example of a semiconductor quantum well device grown on a polar plane of a substrate.
FIG. 8B illustrates energy bands of an example of a semiconductor quantum well device grown on a nonpolar plane of a substrate.

FIG. 8A illustrates energy bands of an example of a semiconductor quantum well device 800 grown on a polar plane of a semiconductor substrate. In the absence of an electric field, electrons and holes in a quantum well may only occupy states within a discrete set of energy sub-bands. Thus, only a discrete set of frequencies of light may be absorbed or emitted by the quantum well. When an electric field is applied to the quantum well, the carrier states may shift. In a semiconductor quantum well device grown on the polar c-plane of a semiconductor substrate, the piezoelectric field $E_{PZ}$ in the growth direction (i.e., the carrier transport direction in the quantum well) may be the strongest and may be much higher than the built-in electric field $E_{bi}$ of a p-n junction. Thus, as shown in FIG. 8A, the electron energy level 812 in conduction band 810 may shift to lower energy levels, while the hole energy level 822 in valence band 820 may shift to higher energy levels. Thus, a bandgap 830 between the conduction band and valence band may reduce, which in turn reduces the frequency of the absorbed or emitted light.

Additionally, the electric field may shift electrons and holes to opposite sides of the quantum well. For example, as shown in FIG. 8A, the electron energy level 812 in conduction band 810 and the hole energy level 822 in valence band 820 are tilted in the quantum well due to the electric field. Thus, more electrons may be close to the p-GaN side, and more holes may be close to the N—GaN side. This spatial separation between the electrons and holes is limited by the presence of the potential barriers around the quantum well, and may cause a drastic decrease of the spatial electron-hole overlap (and hence the overlap integral of the holes and the electrons or the effective thickness $d_{eff}$ of the active region) in the direction of the c-axis, which may in turn reduce the radiative recombination rate and thus the internal quantum efficiency of the system.

FIG. 8B illustrates energy bands of an example of a semiconductor quantum well device 850 grown on a nonpolar plane (e.g., m-plane) of a substrate. In a semiconductor quantum well device grown on the nonpolar m-plane of the substrate, the piezoelectric field $E_{PZ}$ in the growth direction may be zero, and the built-in electric field $E_{bi}$ of a p-n junction may be relatively low. Thus, as shown in FIG. 8B, the electron energy level 862 in conduction band 860 may be flat or may have a minimum shift, and the hole energy level 872 in valence band 870 may be flat or have a minimum shift. Thus, in contrast to bandgap 830 shown in FIG. 8A, bandgap 880 between the conduction band and valence band in semiconductor quantum well device 850 may not be reduced, and thus the frequency of the absorbed or emitted light may not be reduced. In addition, because electron energy level 862 in conduction band 860 and hole energy level 872 in valence band 870 in the quantum well may be flat, the distribution of electrons and holes in the quantum well may be uniform and may overlap in the entire quantum well region. As such, the overlap integral of the holes and the electrons and thus the radiative recombination rate and the internal quantum efficiency of semiconductor quantum well device 850 may be high.

While the Auger recombination due to high current density (and high charge carrier density) may be an intrinsic process depending on material properties, non-radiative SRH recombination depends on the quality of material, such as the defect density in the active region. As described above with respect to FIGS. 5A and 5B, LEDs may be fabricated by etching a mesa structure into the active emitting layers to confine carriers within the injection area of the device and to expose the n-type material beneath the active emitting layers for electrical contact. Etching the mesa structures may lead to the formation of mesa sidewalls that are orthogonal to the growth plane. Active region in proximity to the exposed sidewalls may have a higher rates of SRH recombination than the bulk region that is far from the surface, due to a higher density of defects formed during the etch. Charge carriers injected into active regions that are within a minority carrier diffusion length from the surface may be subject to the higher SRH recombination rate, where the minority carrier diffusion length is the average distance a minority carrier moves before recombining.

For traditional, broad area LEDs used in lighting and backlighting applications (e.g., with about 0.1 mm$^2$ to about 1 mm$^2$ lateral device area), the sidewall surfaces are at the far extents of the devices and the devices can be designed such that little or no current is injected into regions within a minority carrier diffusion length of the mesa sidewalls, and thus the overall rate of SRH recombination may be low. However, in micro-LEDs, such as III-nitride micro-LEDs fabricated on (0001) oriented (i.e., c-plane) substrate (e.g., sapphire or GaN), as the size of the LED is reduced to a value comparable to or having a same order of magnitude as the minority carrier diffusion length (which may depend on the doping density and may be between, for example, about 0.1 µm to about 1 µm), a greater proportion of the total active region falls within the minority carrier diffusion length from the LED sidewall surface and thus more injected carriers are subjected to the higher SRH recombination rate. This can cause the leakage current of the LED to increase and the efficiency of the LED to decrease as the size of the LED decreases, and/or cause the peak efficiency operating current to increase as the size of the LED decreases.

Non-radiative surface recombination may be governed, in part, by the surface recombination velocity (SRV) of the material, which describes the rate at which charge carriers are captured by a surface defect. Surface recombination velocity of a material may be reduced by passivating the surface with a suitable dielectric material, such as $SiO_2$, $SiN_x$, or $Al_2O_3$. The SRV may also be reduced by etching away highly defective surface material using a chemical treatment. Despite these efforts to reduce surface recombination, when the micro-LED mesa size reduces, the efficiency of the micro-LED generally still decreases and the peak efficiency operating current density generally still increases. These effects can lower the overall electrical-to-optical power conversion efficiency (referred to as the wall-plug efficiency) of the device.

Figure 9:
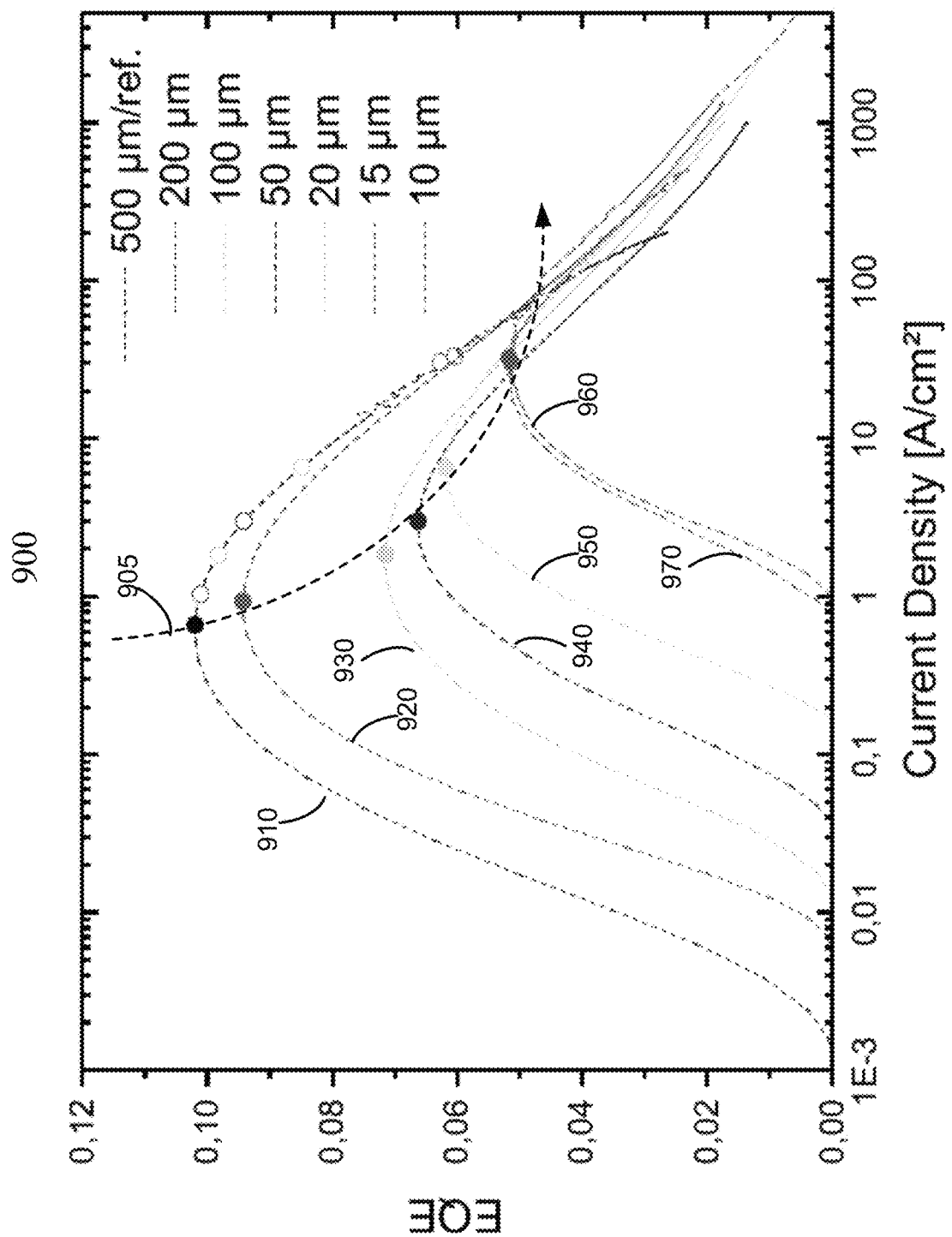
FIG. 9 illustrates the relationship between the external quantum efficiency and the current density for examples of polar micro-LED devices of different sizes.

FIG. 9 is a chart 900 illustrating the relationship between the external quantum efficiency and the current density for examples of polar micro-LED devices of different sizes. The x-axis in chart 900 represents the current density (in $A/cm^2$) of an LED device in logarithmic scale, and the y-axis represents the external quantum efficiency of the LED device at the corresponding current density. In the examples illustrated in FIG. 9, the micro-LED devices are fabricated on III-nitride materials grown on the c-plane of a substrate. Curve 910 shows the external quantum efficiency as a function of the current density for a micro-LED device having a linear dimension of about 500 µm. Curves 920, 930, 940, 950 show the external quantum efficiency as a function of the current density for micro-LED devices having a linear dimension of about 200 µm, about 100 µm, about 50 µm, and about 20 µm, respectively. Curves 960 and 970 show the external quantum efficiency as a function of the current density for micro-LED devices having a linear dimension of about 15 µm and about 10 µm, respectively, which may be close to the order of magnitude of the minority carrier diffusion length.

As shown by curves 910-970, the external quantum efficiency of a micro-LED device may be low when the current density (and thus the charge carrier density N) is low, where the low external quantum efficiency may be caused by the relatively high non-radiative SRH recombination or leakage when the charge carrier density N is low according to equation (2). As the current density (and thus the charge carrier density N) increases, the external quantum efficiency may increase because the radiative recombination may increase at a higher rate than the non-radiative SRH recombination. The external quantum efficiency may reach a peak value at a certain current density value, after which the external quantum efficiency may drop due to, for example, the relatively high non-radiative Auger recombination as described above.

As shown by a trend curve 905 in FIG. 9, in general, the larger the micro-LED, the higher the peak efficiency. For example, the peak efficiency of the micro-LED having a linear dimension of about 10 µm (shown by curve 970) may be much lower than the peak efficiency of the micro-LED having a linear dimension of about 500 µm (shown by curve 910). In addition, in general, the larger the micro-LED, the lower the current density needed to achieve the peak efficiency. For example, the peak efficiency current density of the micro-LED having a linear dimension of about 10 µm (shown by curve 970) may be much higher (e.g., >10 times) than the peak efficiency current density of the micro-LED having a linear dimension of about 500 µm (shown by curve 910). Furthermore, FIG. 9 shows that the onset of EQE appears at higher current densities for smaller LEDs due to, for example, leakage current and/or an increased proportion of non-radiative SRH recombination at sidewall defects. As shown in FIG. 9, the smaller micro-LED devices (e.g., having a linear dimension of about 15 µm or about 10 µm) may have significant low-voltage leakage or SRH recombination, where the EQE at a current density below about 1 $A/cm^2$ is very small.

In addition to the lower quantum efficiency, micro-LEDs fabricated in GaN layers grown on the c-plane may also emit light that is unpolarized. The valence bands of GaN can be characterized with x-, y-, and z-directions corresponding to the nonpolar a-direction ($11\bar{2}0$), the nonpolar m-direction ($1\bar{1}00$), and the polar c-direction ($0001$), respectively, as shown in FIGS. 7A and 7B. The valence bands of GaN may be derived from the nitrogen $p_x$, $p_y$, and $p_z$ orbitals. The top two valence bands (heavy-hole (HH) band and light-hole (LH) band) in c-plane GaN may have the symmetry of $|X+iY\rangle$ and $|X-iY\rangle$, and the split-off band may have the symmetry of $|Z\rangle$. For c-plane heterostructures, such as InGaN/GaN or AlGaN/GaN, the biaxial compressive stress in the coherently stressed alloy layer (InGaN or AlGaN) may be isotropic in the x- and y-directions, which may produce an equal mixture of $|X\rangle$ and $|Y\rangle$ states in the heavy-hole and light-hole bands and may result in an isotropic light emission in the surface normal direction of the emission layer. Therefore, the emitted light may have a low degree of linear polarization that may be close to zero.

Figure 10A:
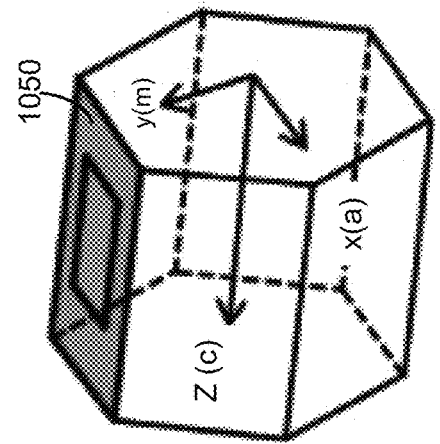
FIG. 10A illustrates the band diagram of an example of a semiconductor quantum well device grown on a polar plane of a substrate.

FIG. 10A illustrates a band diagram 1000 of an example of a semiconductor quantum well device grown on a polar plane of a substrate. When charge carriers (e.g., electrons or holes) are moving in a material, they move like waves that have specific wavelengths (λ) and frequencies (f). The charge carriers are quantum mechanical particles that have momentum and energy. The energy of a charge carrier is proportional to the frequency f, and the momentum of the charge carrier is proportional to the wave vector k (i.e., $2\pi/\lambda$). The energy level of electrons in the conduction band at the gamma point is shown by an energy level 1010. The holes in the valence band may have different effective masses due to their different responses to electrical field in three independent moving directions (e.g., x, y, and z directions) in the three-dimensional space. For example, holes may be relatively easy to move along the direction of bonds between atoms, and may be hard to move in a direction that is very different from (e.g., perpendicular to) the direction of bonds. The effective masses of some holes (referred to as heavy holes) are larger because these holes respond to electric field at a lower speed in their moving direction. The effective masses of some holes (referred to as light holes) are lower because these holes can respond to electric field in their moving direction at a higher speed. Some holes may be in the split-off (or spin-orbit) band corresponding to crystal-field split-off holes (CHs). The CH band may be separate from the HH band and LH band by a spin-orbit interaction energy.

As described above, the valence band structure of wurtzite GaN is developed from the $|X\rangle$, $|Y\rangle$, and $|Z\rangle$ eigenstates, which may correspond to the nitrogen $p_x$, $p_y$, and $p_z$ orbitals, respectively. The six band structure bases of the wurtzite structure including spins can be expressed as $(1/\sqrt{2})|X+iY,\uparrow\rangle$, $(1/\sqrt{2})|X+iY,\downarrow\rangle$, $|Z,\uparrow\rangle$, $|Z,\downarrow\rangle$, $(1/\sqrt{2})|X-iY,\uparrow\rangle$ and $(1/\sqrt{2})|X-iY,\downarrow\rangle$.

The polarization of the emission light is strongly affected by these bases. For the c-plane structure, the holes in the valence band may be in one of three subbands shown by energy levels 1020, 1030, and 1040. The upper two bands shown by energy levels 1020 and 1030 are $|X\pm iY\rangle$ states and correspond to the heavy-hole band and light-hole band, where the $|X\rangle$ and $|Y\rangle$ states are equally mixed in each of the two upper bands. For c-plane structures, the equibiaxial compressive stress for an InGaN layer may not change the separation of the top two valence bands represented by energy levels 1020 and 1030 because the in-plane compressive strain is in the x- and y-directions and the tensile strain is in the z-direction, and thus the $|X\rangle$ and $|Y\rangle$ states may be moved up equally and the $|Z\rangle$ state associated with energy level 1040 may be moved down, as shown in FIG. 10A. Therefore, in a semiconductor quantum well device grown on a polar plane (i.e., c-plane) as shown in FIG. 10A, the polarization of the emitted light normal to the top surface of the LED chip may be isotropic, and thus the emitted light may have a degree of linear polarization close to zero.

Thus, conventional III-nitride LEDs grown on the c-plane oriented GaN may have a higher low-voltage leakage, a lower efficiency at a same current density, a lower peak efficiency, and a higher operating current density to achieve the peak efficiency, when the device shrinks. In addition, the emitted light from conventional III-nitride LEDs grown on the c-plane may be unpolarized.

III-nitride LEDs can be grown on other crystal planes, such as nonpolar planes or semi-polar growth planes between the polar c-plane and nonpolar a- and m-planes. Anisotropic strain (e.g., tensile and compressive stresses) may naturally exist in the nonpolar a or m-plane, the semi-polar plane, or an engineered c-plane with preferentially released strain in a direction, and may cause the band structure and the light emission polarization properties to change. For example, the anisotropic stress may change the $X\rangle$ and $|Y\rangle$ states differently, and thus may cause the $|X\pm iY\rangle$ states corresponding to the HH band and LH band to become unequally mixed and split into predominantly the $|X\rangle$ and $|Y\rangle$ states at the gamma (Γ) point, and thus light linearly polarized in one direction may be more preferentially generated than light linearly polarized in other directions.

Figure 10B:
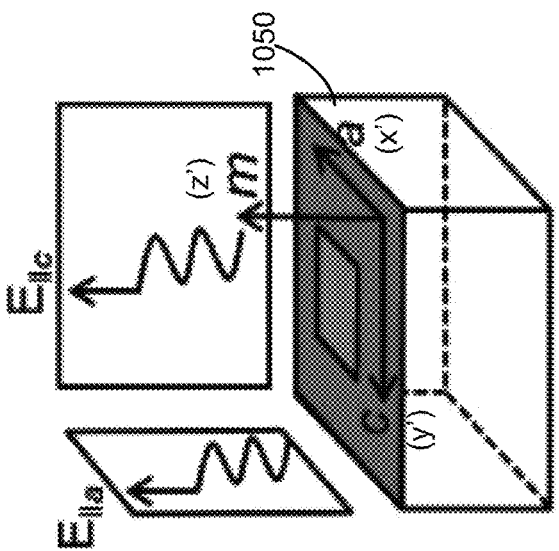
FIG. 10B illustrates an example of a semiconductor quantum well device grown on a nonpolar plane of a substrate.
Figure 10C:
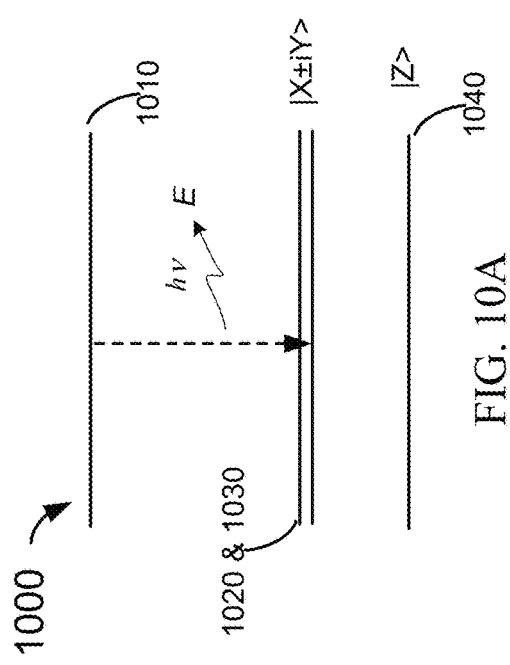
FIG. 10C illustrates the band diagram of an example of an anisotropically strained semiconductor quantum well device grown on a nonpolar plane of a substrate.

FIG. 10B illustrates an example of a semiconductor quantum well device 1050 grown on a nonpolar plane (e.g., m-plane) of a substrate. FIG. 10C illustrates a band diagram 1060 of an example of an anisotropically strained semiconductor quantum well device grown on a nonpolar plane of a substrate, such as semiconductor quantum well device 1050. For nonpolar structures such as semiconductor quantum well device 1050, the unbalanced biaxial stress may break the symmetry in the x-y plane, which may split the $|X\pm iY\rangle$ states into $|X\rangle$ and $|Y\rangle$ states because the $|X\rangle$ and $|Y\rangle$ eigenstates are changed differently by the unbalanced biaxial stress. Therefore, the valence bands of the nonpolar structure may be reconstructed in the order of $|X\rangle$, $|Z\rangle$, and $|Y\rangle$ states with decreasing energy, which may give rise to the polarized emission for emission from the surface.

As shown in FIG. 10C, energy levels of electrons in the conduction band are shown by a curve 1010'. Due to the natural anisotropic strain in the nonpolar plane device (e.g., m-plane device shown in FIG. 7B), the symmetry in the x-y plane may be broken. More specifically, the in-plane compressive strain is in the original x- and z-directions and the tensile strain is in the original y-direction. Thus, the $|Y\rangle$ state may be pulled down and the $|X\rangle$ and $|Z\rangle$ states may be pulled up as shown in FIG. 10C, and hence the $|X\rangle$ and $|Y\rangle$ eigenstates may become unequal. In other words, the degeneracy between the $|X\rangle$ and $|Y\rangle$ eigenstates may be broken. Therefore, the top two valence bands $|X\pm iY\rangle$ may no longer be equally mixed and may split into the $|X\rangle$ and $|Y\rangle$ states. Thus, the holes in the valence band may be in one of three subbands shown by curves 1020', 1030', and 1040', which correspond to the $|X\rangle$, $|Z\rangle$, and $|Y\rangle$ states, respectively.

Figure 10D:
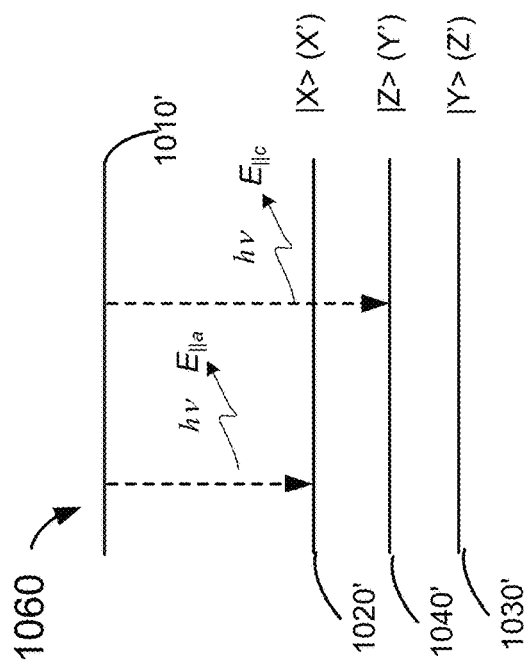
FIG. 10D illustrates the polarization state of light emitted from a nonpolar semiconductor quantum well device.

FIG. 10D illustrates the polarization state of light emitted from nonpolar semiconductor quantum well device 1050. As shown in FIG. 10D, the original y-axis shown in FIG. 10B may become the new z'-axis, and the original z-axis may become the new y'-axis. Because the in-plane compressive strain is in the original x- and z-directions and the tensile strain is in the original y-direction, the original $|Y\rangle$ (or Z') state may be pulled down and the original $|X\rangle$ (or X') and $|Z\rangle$ (or Y') states may be pulled up as shown in FIG. 10C. Therefore, the upper band may be unequally mixed and predominately in the $|X\rangle$ (or X') state (rather than with equally mixed $|X\rangle$ and $|Y\rangle$ states as shown in FIG. 10A), and thus the light emission may become linearly polarized light as shown in FIG. 10D. Thus, the degree of linear polarization of the emitted light may be higher, such as greater than 0.7 or close to 1. For III-nitride LEDs grown on a semi-polar plane between the polar c-plane and nonpolar a- or m-plane, the degree of linear polarization of the emitted light may be between 0 and 1, such as greater than 0.5.

Figure 11B:
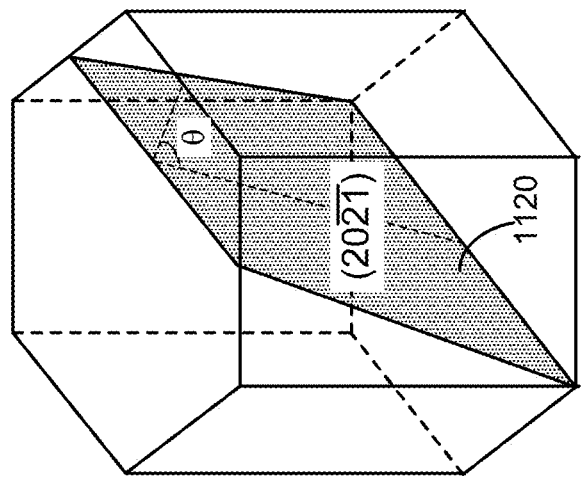
FIG. 11B illustrates another example of a semi-polar plane in a crystal material having a hexagonal crystal lattice structure according to certain embodiments.
Figure 11A:
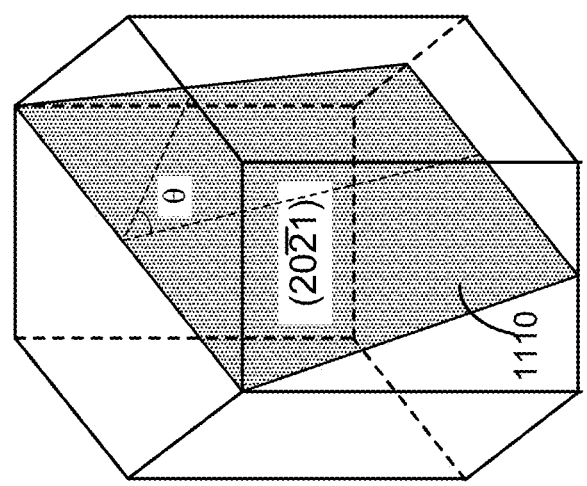
FIG. 11A illustrates an example of a semi-polar plane in a crystal material having a hexagonal crystal lattice structure according to certain embodiments.

FIG. 11A illustrates an example of a semi-polar plane 1110 in a crystal material 1100 having a hexagonal crystal lattice structure according to certain embodiments. FIG. 11B illustrates another example of a semi-polar plane 1120 in crystal material 1100 having a hexagonal crystal lattice structure according to certain embodiments. Crystal material 1100 may include, for example, a III-V semiconductor material, such as GaN, or sapphire. Semi-polar plane 1110 shown in FIG. 11A is the (20$\bar{2}$1) plane, which forms an angle θ about 75° with respect to the c-plane. The (20$\bar{2}$1) plane may be a majority-N plane, where a majority of elements on the plane are N. Semi-polar plane 1120 shown in FIG. 11B is the (20$\bar{2}$1) plane, which forms an angle θ about 105° with respect to the c-plane. The (20$\bar{2}$1) plane may be a majority-Ga plane, where a majority of elements on the plane are Ga. Crystal material 1100 may be cut along a semi-polar plane, such as the (20$\bar{2}$1) plane or the (20$\bar{2}$1) plane, and the facet of crystal material 1100 cut along the semi-polar plane may be used as the growth surface on which epitaxial layers can be grown for fabricating micro-LEDs. GaN layers grown on the (20$\bar{2}$1) plane and GaN layers grown on the (20$\bar{2}$1) plane may have identical stress states but opposite polarization states. For example, an active layer grown on the (20$\bar{2}$1) plane may have a polarization discontinuity at the active region interface with the same sense (i.e. similar direction, different magnitude) as conventional c-plane GaN, whereas an active layer grown on the (20$\bar{2}$1) plane may have a polarization discontinuity of the opposite sense to that of (20$\bar{2}$1) plane or c-plane GaN layer.

According to certain embodiments, micro-LEDs are fabricated on III-nitride material (e.g., GaN) layers having certain semi-polar crystal orientations. The III-nitride material layers may be grown on a substrate (e.g., GaN or sapphire) that is cut along a semi-polar plane and thus may have a surface in the semi-polar plane. The fabricated micro-LED can achieve a better efficiency performance than micro-LED devices fabricated on III-nitride materials with conventional (e.g., c-plane) orientations. More specifically, for micro-LEDs fabricated on III-nitride materials with certain semi-polar orientations between the polar c-plane and nonpolar a- or m-plane, the quantum efficiency of the micro-LEDs does not drop with decreasing micro-LED size, and the operating current at the peak quantum efficiency does not increase with decreasing micro-LED size. Thus, GaN materials with certain orientations can produce better performing micro-LED devices than GaN materials with conventional c-plane orientations.

Micro-LEDs with different semi-polar orientations are manufactured and tested. The experimental results show that using GaN materials with certain semi-polar orientations, such as the $(20\bar{2}1)$ plane GaN material, can result in a sustained peak quantum efficiency and a sustained low (~1 A/cm') peak efficiency drive current density as the micro-LED size decreases. On some other crystallographic orientations, such as the $(20\bar{2}1)$ plane, typical efficiency characteristics with decreasing mesa size as shown in FIG. 9 are observed.

Thus, the orientation of the growth plane may significantly affect the device performance. For example, the device may have a higher performance in efficiency when the device is grown on a semi-polar plane that has an angle between 0° and 90° (such as between about 45° and about 90° or between about 60° and about 90°) with respect to the c-plane. This higher performance of semi-polar GaN micro-LEDs may be due to, for example, the unique crystallography of the semi-polar mesas grown on certain semi-polar planes, where the exposed sidewall facets of the semi-polar micro-LEDs are different from the exposed sidewall facets of conventional c-plane LEDs. For example, the exposed sidewall facets may be majority-N planes, where a majority of the elements in the planes are N, rather than Ga. The exposed sidewall facets may also be easier to passivate with a dielectric material or may be less susceptible to the formation of surface defects. Alternatively or additionally, the defects in semiconductor material layers grown on these semi-polar planes may have an inherently lower SRV, or the lateral diffusion length of the minority carriers may be smaller for semiconductor material layers with the semi-polar orientations. As such, the non-radiative SRH recombination may be reduced even for micro-LEDs with small lateral sizes, such as 5 μm or smaller. In addition, the degree of linear polarization of the emitted light from devices grown on the semi-polar plane can be much higher, and thus the emitted light can be more efficiently coupled into a waveguide.

Figure 12:
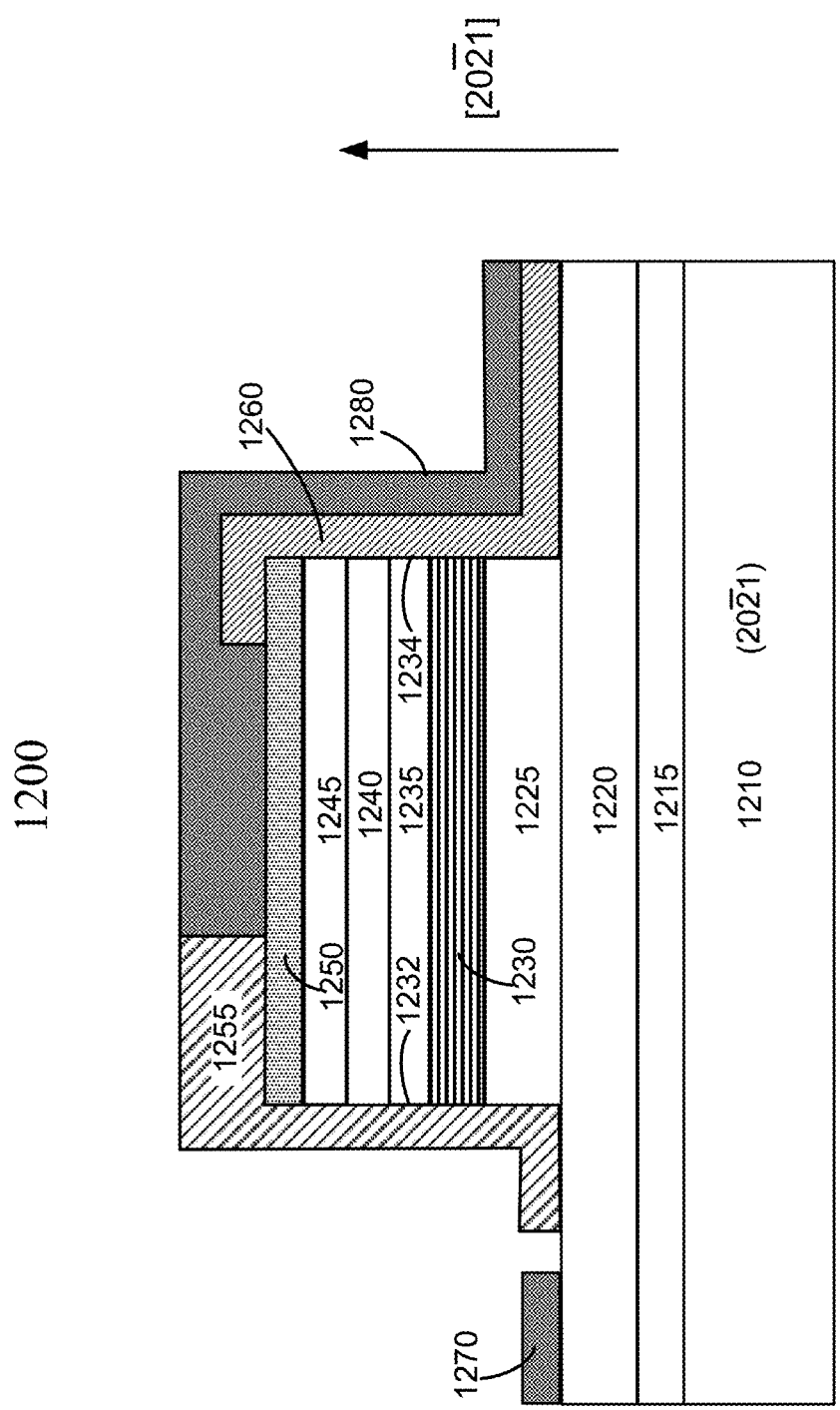
FIG. 12 illustrates an example of a micro-LED device including semiconductor materials having a semi-polar crystal lattice orientation according to certain embodiments.

FIG. 12 is a cross-sectional view of an example of a micro-LED device 1200 including semiconductor materials having a semi-polar crystal lattice orientation according to certain embodiments. Micro-LED device 1200 may include a substrate 1210, where a surface 1212 of substrate 1210 is a semi-polar $(20\bar{2}1)$ plane. Substrate 1210 may include, for example, a sapphire substrate, a GaN substrate, or another III-V semiconductor substrate. A buffer layer 1215 may be grown on surface 1212 of substrate 1210. Buffer layer 1215 may be used to accommodate the differences in two crystallographic structures and to reduce misfit strain and misfit dislocations. One example of buffer layer 1215 may include an undoped or unintentionally doped (UID) GaN. An n-GaN layer 1220 may be formed on buffer layer 1215. N—GaN layer 1220 may be a GaN layer doped with, for example, silicon or germanium. A barrier layer 1225 may be formed on n-GaN layer 1220. Barrier layer 1225 may include, for example, InGaN/GaN superlattice. An active layer 1230 may be formed on barrier layer 1225. Active layer 1230 may include one or more quantum wells, such as a multiple-quantum-well (MQW) including multiple (e.g., 2-6) quantum wells. In one example, active layer 1230 may include an InGaN/GaN MQW that can generate green or blue light (e.g., at about 447 nm). An electron-blocking layer 1235 may be formed on active layer 1230 to reduce the electron leakage current and improve the efficiency of the LED. A p-GaN layer 1240 may be formed on electron-blocking layer 1235. p-GaN layer 1240 may be doped with, for example, Mg, Mg, Ca, Zn, or Be. A $p^+$-GaN layer 1245 (or $p^{++}$-GaN layer) may be formed on p-GaN layer 1240 to reduce the contact resistance. A conductor layer 1250, such as a transparent ITO layer, may be deposited on $p^+$-GaN layer 1245.

The layer stack that includes barrier layer 1225, active layer 1230, electron-blocking layer 1235, p-GaN layer 1240, $p^+$-GaN layer 1245, conductor layer 1250, and, in some embodiments, a portion of n-GaN layer 1220 may be etched to form a mesa structure. The mesa structure may include sidewalls 1232 and 1234, which may be passivated by a passivation layer that includes, for example, a $SiO_2$, $SiN_x$, or $Al_2O_3$ layer. In some embodiments, at least some portions of sidewall 1232 or 1234 may be coated with an omnidirectional reflector (ODR) that includes, for example, $Ta_2O_5$ and/or $SiO_2$. Electrode layers 1270 and 1280 may then be formed on n-GaN layer 1220 and conductor layer 1250, respectively. Electrode layers 1270 and 1280 may include, for example, Al, Ni, Au, or any combination thereof.

Figure 13:
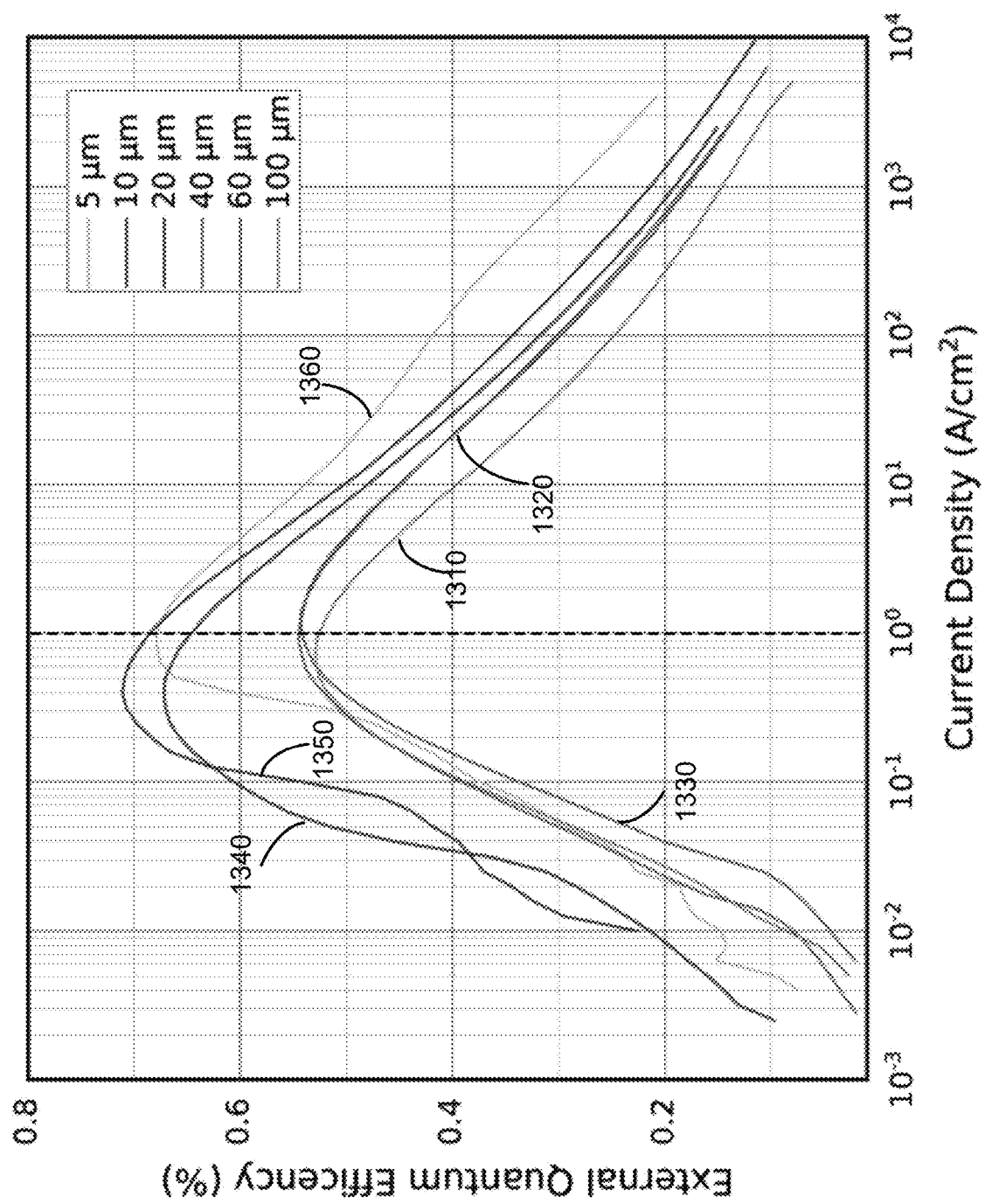
FIG. 13 illustrates the relationship between external quantum efficiency and current density for examples of semi-polar micro-LED devices having different sizes according to certain embodiments.

FIG. 13 illustrates the relationship between external quantum efficiency and current density for examples of semi-polar micro-LED devices having different sizes according to certain embodiments. The examples of micro-LED devices shown in FIG. 13 are grown on the semi-polar $(20\bar{2}1)$ facet of GaN substrates. The examples of micro-LED devices shown in FIG. 13 may have a structure as shown in FIG. 10 and may emit green light. Curve 1310 illustrates the external quantum efficiency as a function of the current density for a micro-LED device having a linear dimension of about 100 μm. Curves 1320, 1330, 1340, 1350 show the external quantum efficiency as a function of the current density for micro-LED devices having a linear dimension of about 60 μm, about 40 μm, about 20 μm, and about 10 μm, respectively. Curve 1360 shows the external quantum efficiency as a function of the current density for a micro-LED device having a linear dimension of about 5 μm.

As shown by curves 1310-1360, the external quantum efficiency of a micro-LED device may be low when the current density (and thus the charge carrier density) is low, where the low external quantum efficiency may be caused by the relatively high non-radiative SRH recombination when the charge carrier density is low. As the current density increases, the external quantum efficiency may increase because the radiative recombination increases at a higher rate than the non-radiative SRH recombination when the charge carrier density is high. The external quantum efficiency may reach a peak value at a certain current density value, after which the external quantum efficiency may drop due to, for example, the higher non-radiative Auger recombination as described above.

As also shown by curves 1310-1360, for a same current density, the external quantum efficiency of a micro-LED device having a smaller die size (e.g., 5, 10, or 20 µm) may be similar to or higher than the external quantum efficiency of a micro-LED device having a larger die size (e.g., 40, 60, or 100 µm). The peak efficiency of micro-LED devices having a linear dimension of about 5 µm (shown by curve 1360), 10 µm (shown by curve 1350), and 20 µm (shown by curve 1340) may be about the same or even higher than the micro-LED devices having a linear dimension of about 100 µm (shown by curve 1310), a linear dimension of about 60 µm (shown by curve 1320), and a linear dimension of about 40 µm (shown by curve 1330). In addition, in general, the peak efficiency current density of the micro-LED having a linear dimension of about 5 µm (shown by curve 1360), 10 µm (shown by curve 1350), and 20 µm (shown by curve 1340) may be about the same (e.g., less than 1 A/cm$^2$) or even lower than the micro-LED devices having a linear dimension of about 100 µm (shown by curve 1310), a linear dimension of about 60 µm (shown by curve 1320), and a linear dimension of about 40 µm (shown by curve 1330). Furthermore, FIG. 13 shows that an EQE greater than a half of the peak EQE can be achieved for the micro-LED devices having a linear dimension of about 5 µm to about 100 µm at a current density of about 0.1 A/cm$^2$.

Thus, compared with the c-plane micro-LED devices (e.g., as shown in FIG. 8), the semi-polar micro-LEDs disclosed herein have a reduced low-voltage leakage for micro-LEDs having vertical mesas due to, for example, lower surface recombination losses as described above. Previously, a reduced low-voltage leakage is generally observed in micro-LEDs having parabolic-shaped mesas rather than vertical mesas. In addition, the semi-polar micro-LEDs disclosed herein can maintain their peak efficiency and have a low peak current density, for example, less than 1 A/cm$^2$, even when the linear dimension of the micro-LED decreases to about 5 µm.

Figure 14:
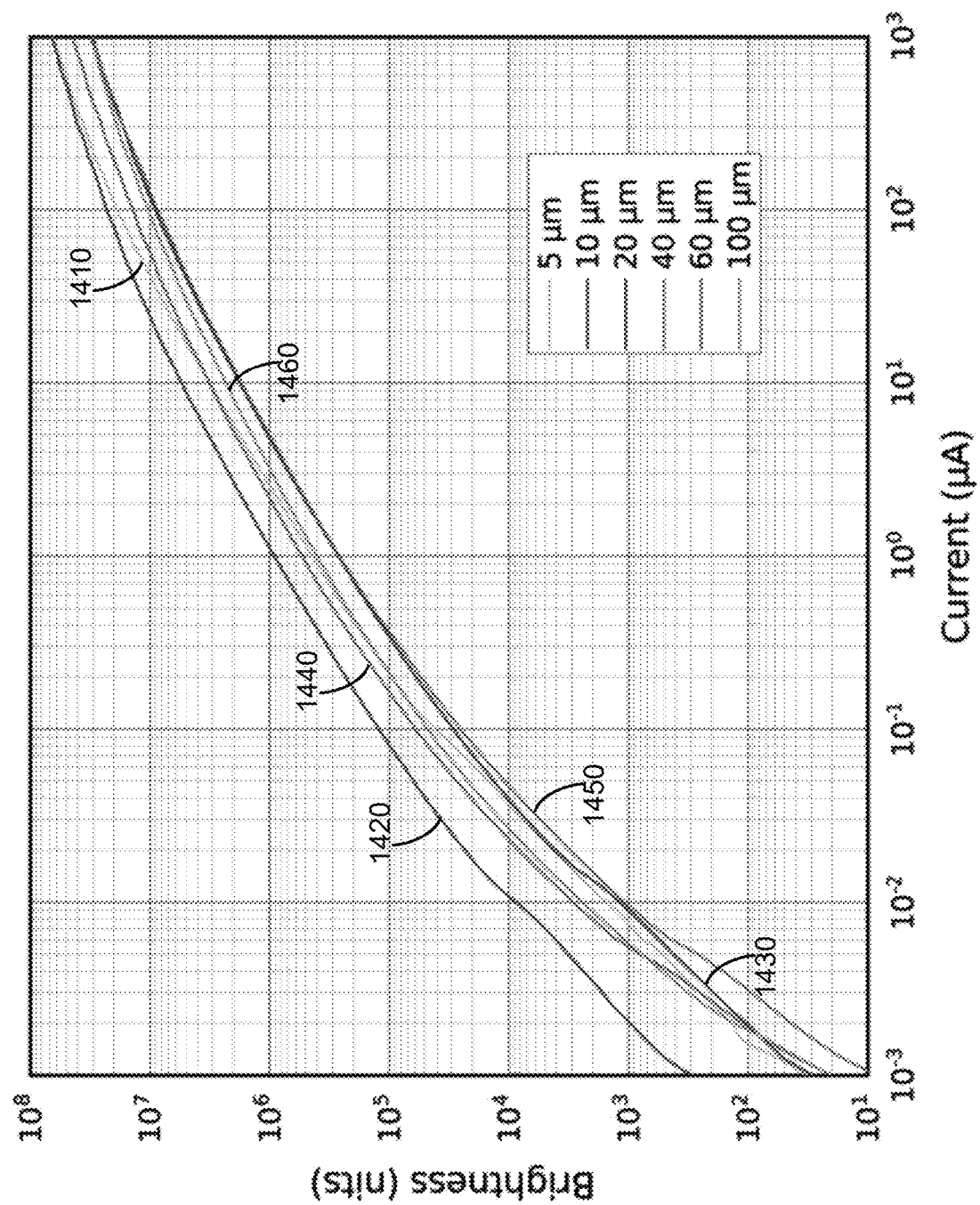
FIG. 14 illustrates the relationship between brightness and bias current for examples of semi-polar micro-LED devices having different sizes according to certain embodiments.

FIG. 14 illustrates the relationship between brightness within a given area and bias current for examples of semi-polar micro-LED devices having different sizes according to certain embodiments. The brightness measures how much light (the luminance) is sent by a light source within a given area, and can be described in nits (candelas per square meter (i.e., cd/m$^2$)). Curves 1410, 1420, 1430, 1440, 1450, and 1460 shown the brightness of micro-LEDs at different bias current (in µA) for micro-LEDs with a linear dimension of about 100 µm, 60 µm, 40 µm, 20 um, 10 µm, and 5 µm, respectively. As shown in FIG. 14, for a micro-LED having a 5×5 µm$^2$ vertical mesa and without light collimation, the brightness of the top-side Lambertian emission (through transparent p-contact, such as p$^+$-GaN layer 1245 and conductor layer 1250 shown in FIG. 12) is about 3 million nits within ±30° when the bias current is about 10 µA.

Figure 15:
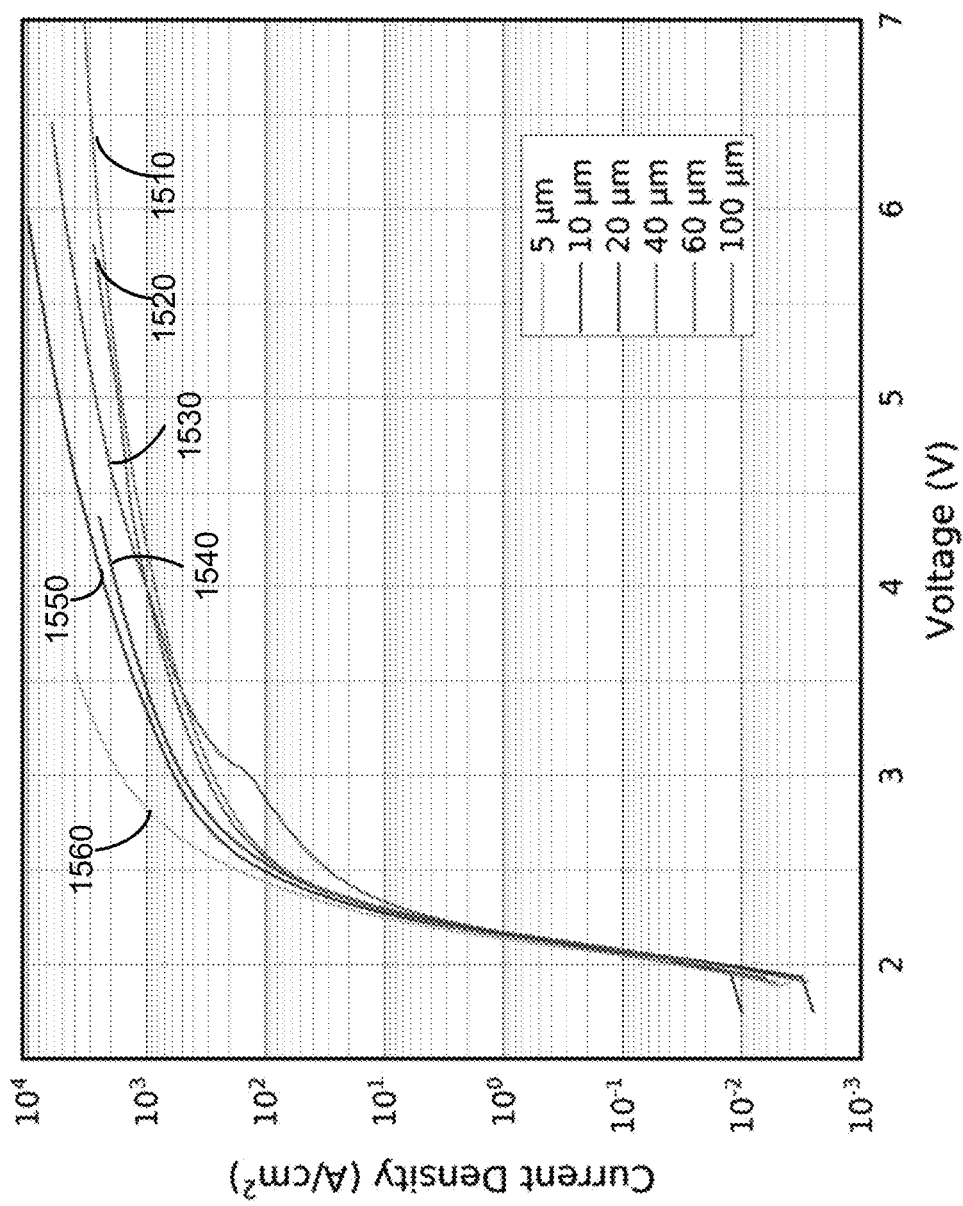
FIG. 15 illustrates the relationship between the current density in the active region and the applied voltage (e.g., I-V curves) for examples of semi-polar micro-LED devices having different sizes according to certain embodiments.

FIG. 15 illustrates the relationship between the current density in the active region and the applied voltage (e.g., I-V curves) for examples of semi-polar micro-LED devices having different sizes according to certain embodiments. Curves 1510, 1520, 1530, 1540, 1550, and 1560 show the I-V curves of semi-polar green micro-LEDs at different driving current (in µA) for micro-LEDs with a linear dimension of about 100 µm, 60 µm, 40 µm, 20 um, 10 µm, and 5 µm, respectively. FIG. 15 shows that the semi-polar green micro-LEDs disclosed herein exhibit good I-V characteristics, where the bias current increases exponentially with the increase of the bias voltage when the bias voltage is around 2 V. Such I-V characteristics may be due to the simplified active region structure and the optimized P$^+$—GaN or P$^{++}$—GaN contact layer as shown in FIG. 12.

As described above, the field in the heterostructure of an LED device may cause the electron and hole energy levels to shift (thus changing the bandgap), which may be referred to as the quantum-confined stark effect (QCSE). The QCSE arises when a quantum-confined system is subjected to an electric field along the axis of confinement. For semiconductor quantum wells, the field may skew the potential well, and cause the hole and electron energy levels to shift, thus decreasing the gap between these levels. These changes are accompanied by a change to the exciton binding energy due to a reduction of the Coulombic interaction as the electrons and holes become spatially separated. The quantum well barriers prevent field ionization that may occur in unconstrained systems under large fields. The QCSE usually manifests as a net decrease in energy of the exciton and thus a red-shift of its optical absorption resonance peak. Heterostructures grown on c-plane substrates may suffer from a strong internal electric field in the carrier transport direction induced by piezo- and spontaneous polarization parallel to the most natural crystal growth direction [0001] (i.e., the c-axis). The polarization-induced fields in the carrier transport direction cause a red-shift of the exciton emission energy inside these heterostructures. For example, as shown in FIG. 8A, due to the distortion of the energy bands caused by the polarization-induced internal field, the photoluminescence emission wavelength of a c-plane quantum well under zero bias may be red-shifted (i.e., having a longer wavelength and a lower energy) compared to a quantum well with no polarization effects. With increasing external bias voltage (and electrical field), the energy bands may flatten and the emission wavelength of the quantum well may blue-shift (i.e., having a shorter wavelength and a higher energy) as the internal electric fields are screened by the injection of free carriers.

As described above with respect to FIGS. 8A and 8B, polarization-induced internal fields in the growth direction are the highest for c-plane device and reach a minimum for m-plane device. For semi-polar planes having an angle θ with respect to the c-plane between 0° and 90° (such as between about 45° and about 90° or between about 60° and about 90°), the polarization field in the growth direction (and thus QCSE) lies somewhere between these extremes. For c-plane LEDs, the blue-shift between spontaneous emission and emission in the biased condition can be significant (e.g., >30 nm). For m-plane LEDs, high quality epitaxial growth of the light emitting material layers may be difficult. Unlike nonpolar GaN, semi-polar GaN may be capable of handling sufficient strain before catastrophic morphological breakdown occurs. As a result, semi-polar GaN may be capable of producing highly efficient LEDs with reduced QCSE and blue-shift.

Figure 16:
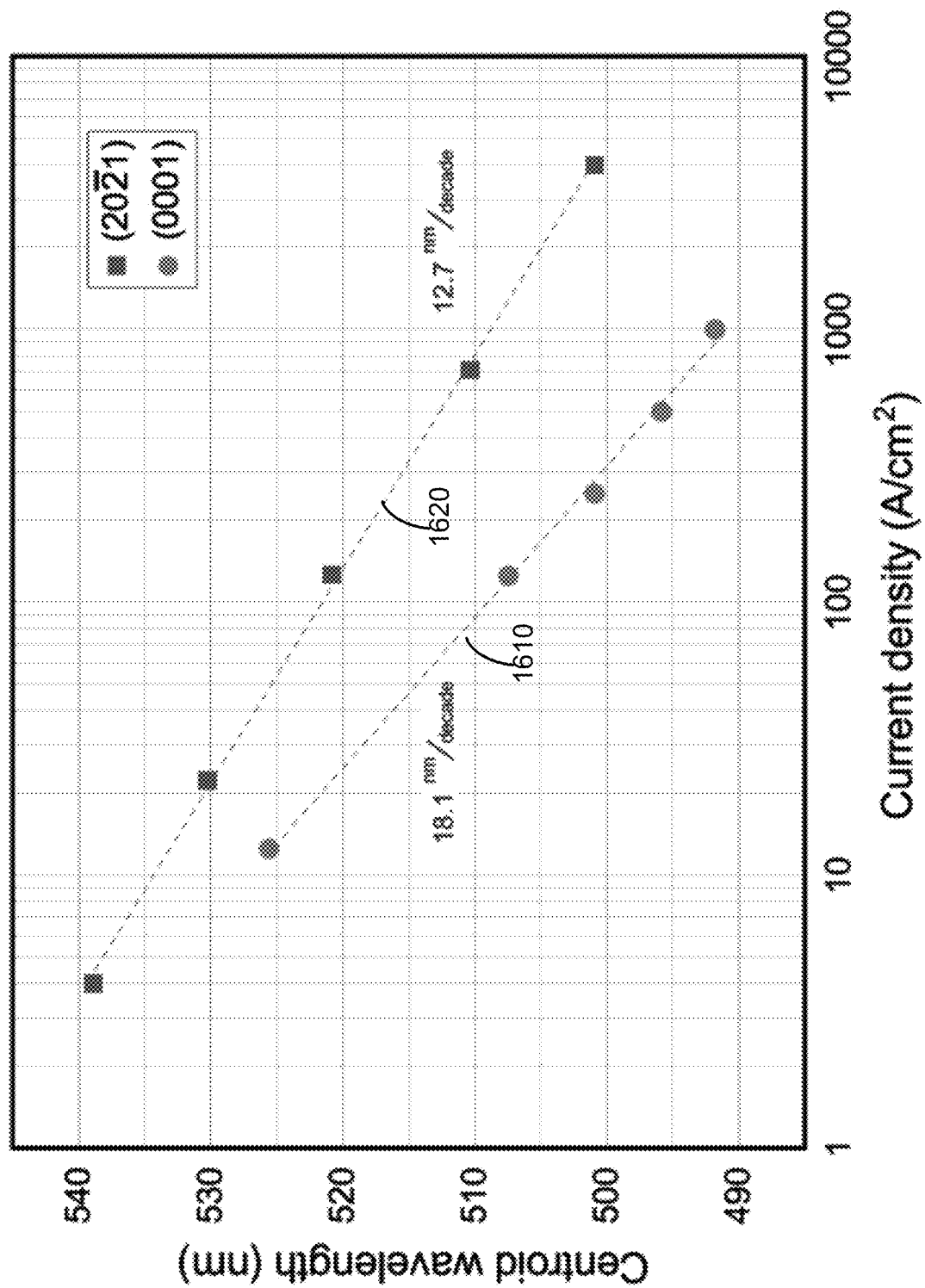
FIG. 16 illustrates the relationship between the wavelength of the emitted light and the current density for micro-LEDs including semiconductor materials with different crystal lattice orientations according to certain embodiments.

FIG. 16 illustrates the relationship between the center wavelength of the emitted light and the bias current density for semi-polar micro-LEDs including semiconductor materials with different crystal lattice orientations according to certain embodiments. A line 1610 shows the change in the center wavelength of the emitted green light with the change in bias current density for micro-LEDs grown on the (0001) plane of a substrate. Line 1610 shows that the center wavelength of the emitted green light changes with the bias current density at a rate of about −18 nm/decade. In other words, the center wavelength of the emitted green light decreases 18 nm when the bias current density increases 10 times. A line 1620 shows the change in the center wavelength of the emitted green light with the change in bias current density for micro-LEDs grown on the semi-polar (20$\bar{2}$1) plane of a substrate. Line 1620 shows that the center wavelength of the emitted green light changes with the bias current density at a slower rate of about −12.7 nm/decade. Thus, FIG. 16 shows that the blue-shift can also be reduced by growing the LEDs on a semi-polar plane (e.g., (20$\bar{2}$1) plane) of a substrate. In other words, the QCSE can be reduced by fabricating the LEDs on the semi-polar (20$\bar{2}$1) plane of a substrate.

Figure 17:
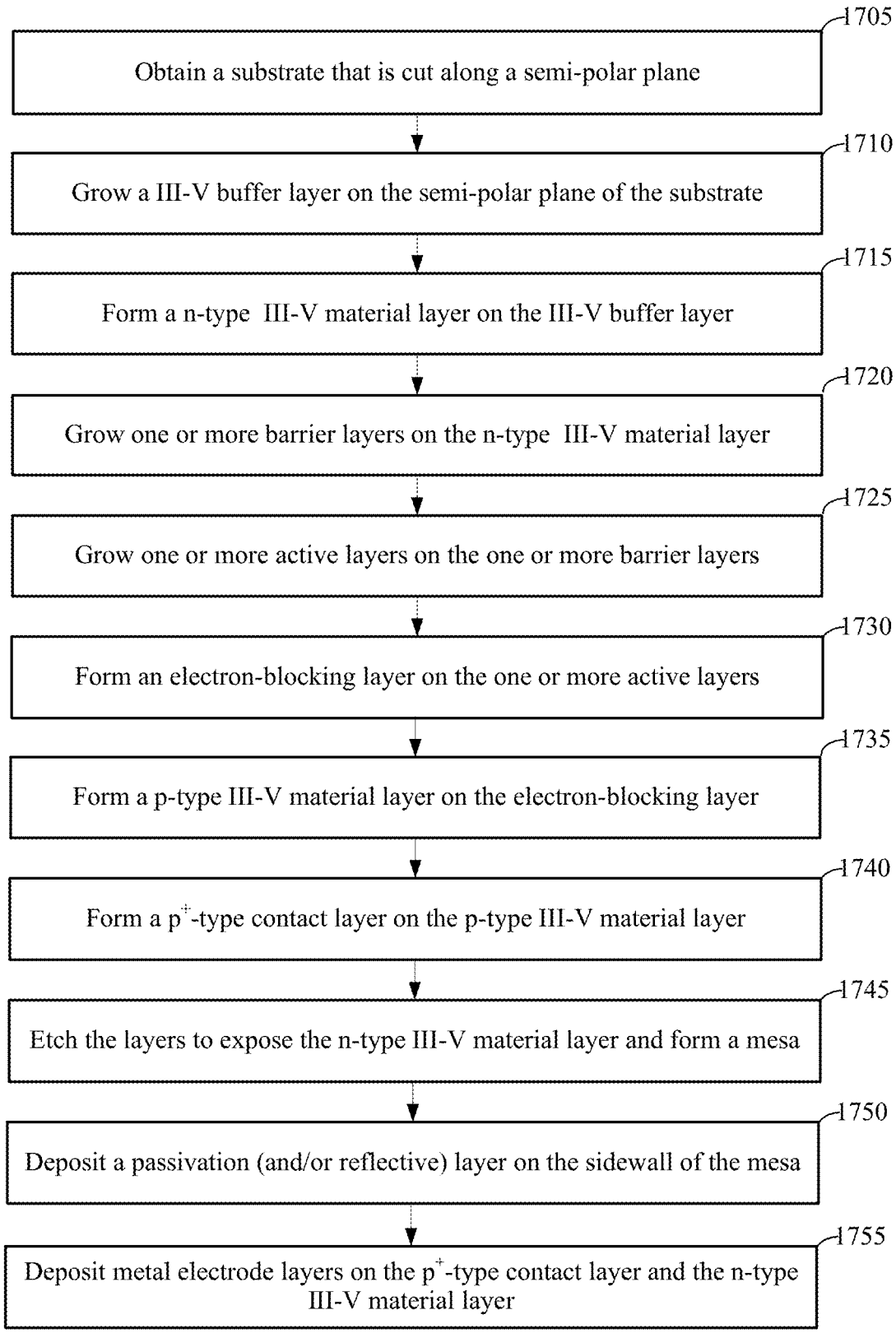
FIG. 17 is a flow chart illustrating an example of a method of fabricating a micro-LED device with an improved light emission efficiency and an improved degree of linear polarization according to certain embodiments.

FIG. 17 is a flow chart 1700 illustrating an example of a method of fabricating a micro-LED device with an improved light emission efficiency and an improved degree of linear polarization according to certain embodiments. The operations described in flow chart 1700 are for illustration purposes only and are not intended to be limiting. In various implementations, modifications may be made to flow chart 1700 to add additional operations or to omit some operations. The operations described in flow chart 1700 may be performed by, for example, one or more semiconductor fabrication systems that include, for example, molecular beam epitaxy (MBE) or metalorganic chemical vapor deposition (MOCVD) equipment.

At block 1705, a substrate, such as a sapphire substrate or a bulk III-V semiconductor substrate (e.g., GaN substrate) may be cut along a semi-polar plane (e.g., the (20$\bar{2}$1) plane). Thus, the exposed facet of the substrate (e.g., substrate 1210) may be a semi-polar plane, rather than the conventional c-plane. Optionally, at block 1710, a III-V buffer layer (e.g., buffer layer 1215) may be grown on the exposed semi-polar facet of the substrate. The buffer layer may be used to accommodate the differences in two crystallographic structures and to reduce misfit strain and misfit dislocations. One example of the buffer layer may include an undoped or unintentionally doped (UID) GaN layer. At block 1715, an n-type III-V material layer (e.g., n-GaN layer 1220) may be formed on the buffer layer. The n-type III-V material layer may be formed by growing a GaN layer and then doping the GaN layer with, for example, silicon or germanium. Optionally, at block 1720, one or more barrier layers (e.g., barrier layer 1225) may be formed on the n-type III-V material layer. The one or more barrier layers may include, for example, a superlattice structure. The superlattice structure may include a periodic structure of layers of two or more materials, such as InGaN and GaN, where the thickness of each layer may be several nanometers.

At block 1725, one or more active layers (e.g., active layer 1230) may be formed on the one or more barrier layers. The one or more active layers may include one or more quantum wells, such as a MQW including multiple (e.g., about 2 to 6) quantum wells. In one example, the one or more active layer includes an InGaN/GaN MQW that can generate green or blue light. Optionally, at block 1730, an electron-blocking layer (e.g., electron-blocking layer 1235) may be formed on the one or more active layers to reduce the electron leakage current and improve the efficiency of the LED. In one example, the electron-blocking layer may include an AlGaN layer. At block 1735, a p-type III-V material layer (e.g., p-GaN layer 1240) may be formed on the electron-blocking layer by, for example, growing a GaN layer and doping the GaN layer with, for example, Mg, Mg, Ca, Zn, or Be. At block 1740, a p$^+$-type or p$^{++}$-type contact layer (e.g., p$^+$-GaN layer 1245) may be formed on the p-type III-V material layer to reduce the contact resistance. The p$^+$-type or p$^{++}$-type contact layer may include, for example, a GaN layer heavily doped with Mg. Optionally, a conductor layer (e.g., conductor layer 1250), such as a transparent ITO layer, may be deposited on the p$^+$-type or p$^{++}$-type contact layer.

At block 1745, the layer stack that includes, for example, the barrier layer, the active layer(s), the electron-blocking layer, the p-type III-V material layer, the p$^+$-type contact layer, the conductor layer, and, in some embodiments, a portion of the n-type III-V material layer, may be etched to form a mesa structure, such as a vertical mesa structure. The mesa structure may include sidewalls (e.g., sidewalls 1232 and 1234). At block 1750, a passivation and/or reflection layer may be deposited on the sidewalls of the mesa structure. The passivation layer may include, for example, a $SiO_2$, $SiN_x$, or $Al_2O_3$ layer. In some embodiments, at least some portions of the sidewalls may be coated with an omnidirectional reflector (ODR) that includes, for example, $Ta_2O_5$ and/or $SiO_2$. The passivation and/or reflection layer may help to reflect the photons emitted by the active layers out of the LED to improve the extraction efficiency of the LED. In some embodiments, before forming the passivation and/or reflection layer, the sidewalls of the mesa structure may be chemically etched to remove the defects at the sidewalls due to physical etching. At block 1755, metal electrode layers (e.g., electrode layers 1270 and 1280) may be deposited on the n-type III-V material layer and the p+-type contact layer (or the conductor layer), respectively. The metal electrode layers may include, for example, Al, Ni, Au, or any combination thereof.

It is noted that even though only one mesa structure (and one micro-LED) is described with respect to FIG. 17, in some embodiments, at block 1745, many mesa structures, such as a one-dimensional or two-dimensional array of mesa structures, may be etched on a same die or a same wafer that has the layers of III-V materials grown on a same substrate. The passivation and/or reflection layer may be deposited on the sidewalls of the array of mesa structures at block 1750. A metal electrode layer may be deposited on the p$^+$-type contact layer of each of the array of mesa structures to form an electrode (e.g., anode) for each of an array of micro-LEDs at block 1755. In some embodiments, the array of micro-LEDs may share a same metal contact (e.g., a shared cathode) on the n-type III-V material layer, and can be individually addressed through the respective anode. The array of micro-LEDs fabricated on the same die or same wafer may have similar characteristics and performance, and thus a better uniformity among the array of micro-LEDs.

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 18:
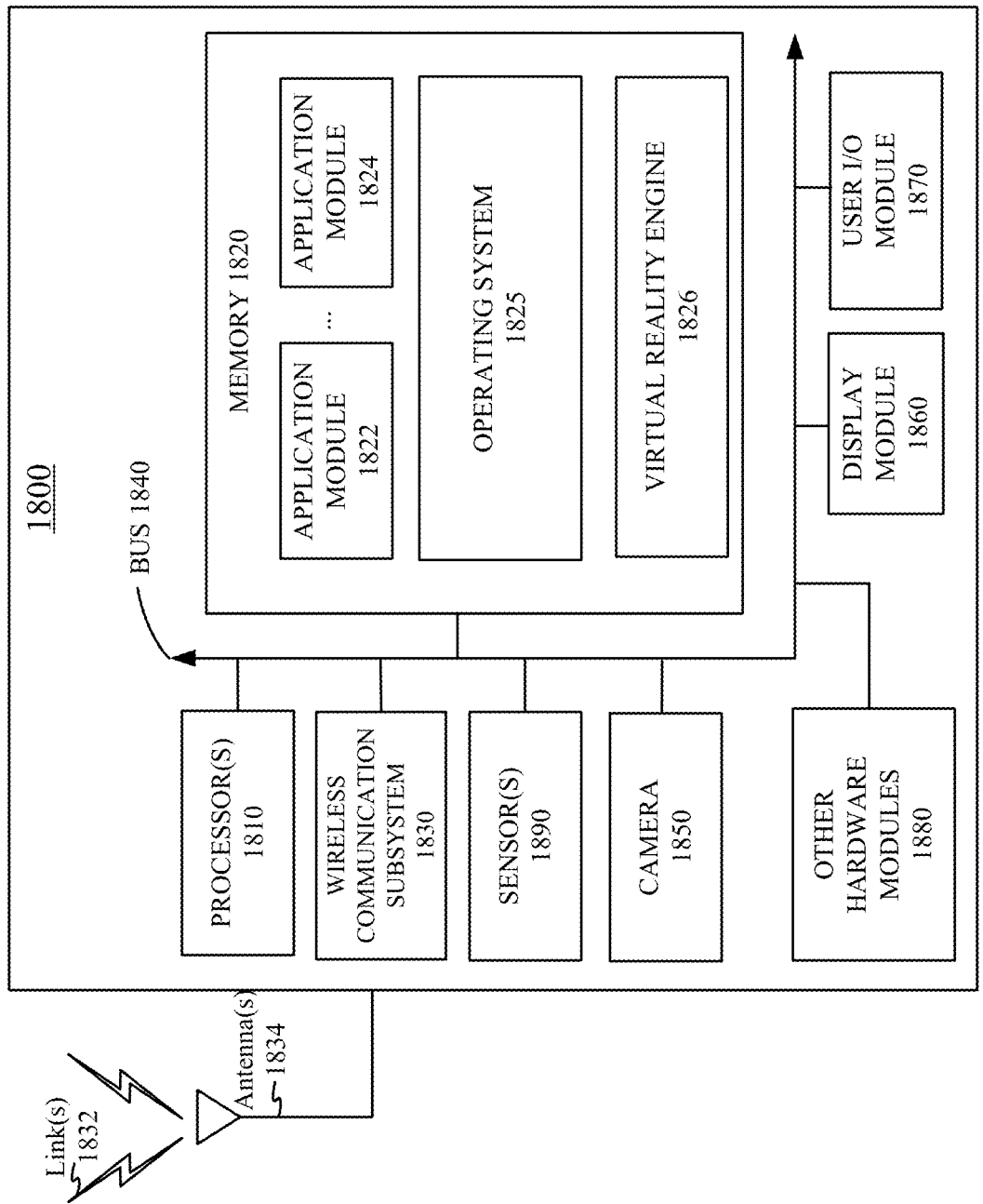
FIG. 18 is a simplified block diagram of an electronic system of an example of a near-eye display according to certain embodiments.

FIG. 18 is a simplified block diagram of an example electronic system 1800 of an example near-eye display (e.g., HMD device) for implementing some of the examples disclosed herein. Electronic system 1800 may be used as the electronic system of an HMD device or other near-eye displays described above. In this example, electronic system 1800 may include one or more processor(s) 1810 and a memory 1820. Processor(s) 1810 may be configured to execute instructions for performing operations at a number of components, and can be, for example, a general-purpose processor or microprocessor suitable for implementation within a portable electronic device. Processor(s) 1810 may be communicatively coupled with a plurality of components within electronic system 1800. To realize this communicative coupling, processor(s) 1810 may communicate with the other illustrated components across a bus 1840. Bus 1840 may be any subsystem adapted to transfer data within electronic system 1800. Bus 1840 may include a plurality of computer buses and additional circuitry to transfer data.

Memory 1820 may be coupled to processor(s) 1810. In some embodiments, memory 1820 may offer both short-term and long-term storage and may be divided into several units. Memory 1820 may be volatile, such as static random access memory (SRAM) and/or dynamic random access memory (DRAM) and/or non-volatile, such as read-only memory (ROM), flash memory, and the like. Furthermore, memory 1820 may include removable storage devices, such as secure digital (SD) cards. Memory 1820 may provide storage of computer-readable instructions, data structures, program modules, and other data for electronic system 1800. In some embodiments, memory 1820 may be distributed into different hardware modules. A set of instructions and/or code might be stored on memory 1820. The instructions might take the form of executable code that may be executable by electronic system 1800, and/or might take the form of source and/or installable code, which, upon compilation and/or installation on electronic system 1800 (e.g., using any of a variety of generally available compilers, installation programs, compression/decompression utilities, etc.), may take the form of executable code.

In some embodiments, memory 1820 may store a plurality of application modules 1822 through 1824, which may include any number of applications. Examples of applications may include gaming applications, conferencing applications, video playback applications, or other suitable applications. The applications may include a depth sensing function or eye tracking function. Application modules 1822-1824 may include particular instructions to be executed by processor(s) 1810. In some embodiments, certain applications or parts of application modules 1822-1824 may be executable by other hardware modules 1880. In certain embodiments, memory 1820 may additionally include secure memory, which may include additional security controls to prevent copying or other unauthorized access to secure information.

In some embodiments, memory 1820 may include an operating system 1825 loaded therein. Operating system 1825 may be operable to initiate the execution of the instructions provided by application modules 1822-1824 and/or manage other hardware modules 1880 as well as interfaces with a wireless communication subsystem 1830 which may include one or more wireless transceivers. Operating system 1825 may be adapted to perform other operations across the components of electronic system 1800 including threading, resource management, data storage control and other similar functionality.

Wireless communication subsystem 1830 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1800 may include one or more antennas 1834 for wireless communication as part of wireless communication subsystem 1830 or as a separate component coupled to any portion of the system. Depending on desired functionality, wireless communication subsystem 1830 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1830 may permit data to be exchanged with a network, other computer systems, and/or any other devices described herein. Wireless communication subsystem 1830 may include a means for transmitting or receiving data, such as identifiers of HMD devices, position data, a geographic map, a heat map, photos, or videos, using antenna(s) 1834 and wireless link(s) 1832. Wireless communication subsystem 1830, processor(s) 1810, and memory 1820 may together comprise at least a part of one or more of a means for performing some functions disclosed herein.

Embodiments of electronic system 1800 may also include one or more sensors 1890. Sensor(s) 1890 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1890 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1800 may include a display module 1860. Display module 1860 may be a near-eye display, and may graphically present information, such as images, videos, and various instructions, from electronic system 1800 to a user. Such information may be derived from one or more application modules 1822-1824, virtual reality engine 1826, one or more other hardware modules 1880, a combination thereof, or any other suitable means for resolving graphical content for the user (e.g., by operating system 1825). Display module 1860 may use liquid crystal display (LCD) technology, light-emitting diode (LED) technology (including, for example, OLED, ILED, μ-LED, AMOLED, TOLED, etc.), light emitting polymer display (LPD) technology, or some other display technology. Despite Electronic system 1800 may include a user input/output module 1870. User input/output module 1870 may allow a user to send action requests to electronic system 1800. An action request may be a request to perform a particular action. For example, an action request may be to start or end an application or to perform a particular action within the application. User input/output module 1870 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1800. In some embodiments, user input/output module 1870 may provide haptic feedback to the user in accordance with instructions received from electronic system 1800. For example, the haptic feedback may be provided when an action request is received or has been performed.

Electronic system 1800 may include a camera 1850 that may be used to take photos or videos of a user, for example, for tracking the user's eye position. Camera 1850 may also be used to take photos or videos of the environment, for example, for VR, AR, or MR applications. Camera 1850 may include, for example, a complementary metal-oxide-semiconductor (CMOS) image sensor with a few millions or tens of millions of pixels. In some implementations, camera 1850 may include two or more cameras that may be used to capture 3-D images.

In some embodiments, electronic system 1800 may include a plurality of other hardware modules 1880. Each of other hardware modules 1880 may be a physical module within electronic system 1800. While each of other hardware modules 1880 may be permanently configured as a structure, some of other hardware modules 1880 may be temporarily configured to perform specific functions or temporarily activated. Examples of other hardware modules 1880 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1880 may be implemented in software.

In some embodiments, memory 1820 of electronic system 1800 may also store a virtual reality engine 1826. Virtual reality engine 1826 may execute applications within electronic system 1800 and receive position information, acceleration information, velocity information, predicted future positions, or some combination thereof of the HMD device from the various sensors. In some embodiments, the information received by virtual reality engine 1826 may be used for producing a signal (e.g., display instructions) to display module 1860. For example, if the received information indicates that the user has looked to the left, virtual reality engine 1826 may generate content for the HMD device that mirrors the user's movement in a virtual environment. Additionally, virtual reality engine 1826 may perform an action within an application in response to an action request received from user input/output module 1870 and provide feedback to the user. The provided feedback may be visual, audible, or haptic feedback. In some implementations, processor(s) 1810 may include one or more GPUs that may execute virtual reality engine 1826.

In various implementations, the above-described hardware and modules may be implemented on a single device or on multiple devices that can communicate with one another using wired or wireless connections. For example, in some implementations, some components or modules, such as GPUs, virtual reality engine 1826, and applications (e.g., tracking application), may be implemented on a console separate from the head-mounted display device. In some implementations, one console may be connected to or support more than one HMD.

In alternative configurations, different and/or additional components may be included in electronic system 1800. Similarly, functionality of one or more of the components can be distributed among the components in a manner different from the manner described above. For example, in some embodiments, electronic system 1800 may be modified to include other system environments, such as an AR system environment and/or an MR environment.

Figure 19B:
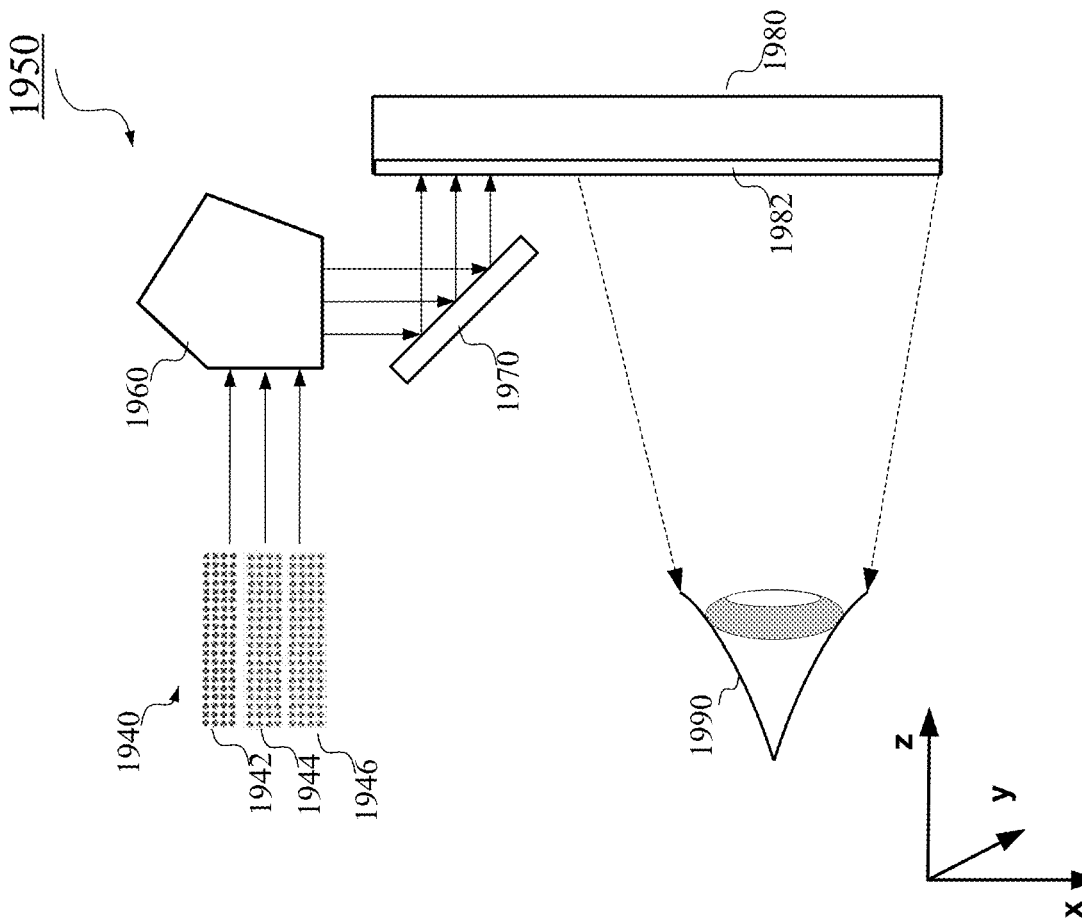
FIG. 19B illustrates an example of a near-eye display device including a waveguide display according to certain embodiments.
Figure 19A:
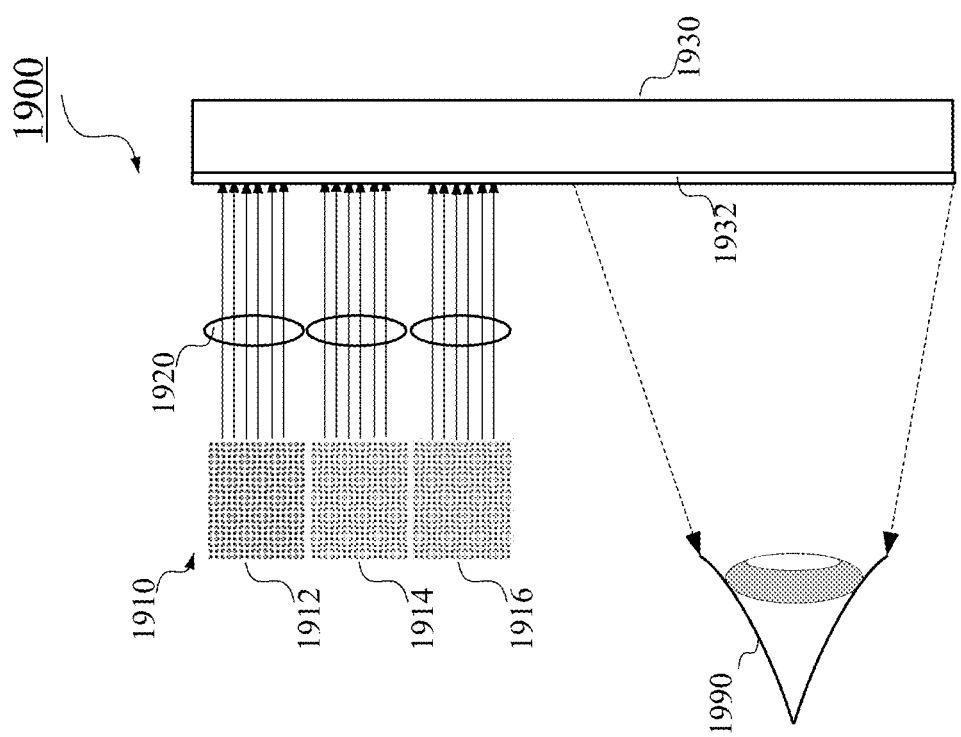
FIG. 19A illustrates an example of a near-eye display device including a waveguide display according to certain embodiments.

FIG. 19A illustrates an example of a near-eye display (NED) device 1900 including a waveguide display 1930 according to certain embodiments. NED device 1900 may be an example of near-eye display 120, augmented reality system 400, or another type of display device. NED device 1900 may include a light source 1910, projection optics 1920, and waveguide display 1930. Light source 1910 may include multiple panels of light emitters for different colors, such as a panel of red light emitters 1912, a panel of green light emitters 1914, and a panel of blue light emitters 1916. The dimensions and pitches of light emitters in light source 1910 may be small. For example, each light emitter may have a diameter less than 2 μm (e.g., about 1.2 μm) and the pitch may be less than 2 μm (e.g., about 1.5 μm). As such, the number of light emitters in each red light emitters 1912, green light emitters 1914, and blue light emitters 1916 can be equal to or greater than the number of pixels in a display image, such as 960×720, 1280×720, 1440×1080, 1920×1080, 2160×1080, or 2560×1080 pixels. Thus, a display image may be generated simultaneously by light source 1910. A scanning element may not be used in NED device 1900.

Before reaching waveguide display 1930, the light emitted by light source 1910 may be conditioned by projection optics 1920, which may include a lens array. Projection optics 1920 may collimate or focus the light emitted by light source 1910 to waveguide display 1930, which may include a coupler 1932 for coupling the light emitted by light source 1910 into waveguide display 1930. The light coupled into waveguide display 1930 may propagate within waveguide display 1930 through, for example, total internal reflection as described above with respect to FIG. 4. Coupler 1932 may also couple portions of the light propagating within waveguide display 1930 out of waveguide display 1930 and towards user's eye 1990.

FIG. 19B illustrates an example of a near-eye display (NED) device 1950 including a waveguide display 1980 according to certain embodiments. In some embodiments, NED device 1950 may use a scanning mirror 1970 to project light from a light source 1940 to an image field where a user's eye 1990 may be located. NED device 1950 may be an example of near-eye display 120, augmented reality system 400, or another type of display device. Light source 1940 may include one or more rows or one or more columns of light emitters of different colors, such as multiple rows of red light emitters 1942, multiple rows of green light emitters 1944, and multiple rows of blue light emitters 1946. For example, red light emitters 1942, green light emitters 1944, and blue light emitters 1946 may each include N rows, each row including, for example, 2560 light emitters (pixels). In some embodiments, light source 1940 may include a single line of light emitters for each color. In some embodiments, light source 1940 may include multiple columns of light emitters for each of red, green, and blue colors, where each column may include, for example, 1080 light emitters. In some embodiments, the dimensions and/or pitches of the light emitters in light source 1940 may be relatively large (e.g., about 3-5 μm) and thus light source 1940 may not include sufficient light emitters for simultaneously generating a full display image. For example, the number of light emitters for a single color may be fewer than the number of pixels (e.g., 2560×1080 pixels) in a display image. The light emitted by light source 1940 may be a set of collimated or diverging beams of light.

Before reaching scanning mirror 1970, the light emitted by light source 1940 may be conditioned by various optical devices, such as collimating lenses or a freeform optical element 1960. Freeform optical element 1960 may include, for example, a multi-facets prism or another light folding element that may direct the light emitted by light source 1940 towards scanning mirror 1970, such as changing the propagation direction of the light emitted by light source 1940 by, for example, about 90° or larger. In some embodiments, freeform optical element 1960 may be rotatable to scan the light. Scanning mirror 1970 and/or freeform optical element 1960 may reflect and project the light emitted by light source 1940 to waveguide display 1980, which may include a coupler 1982 for coupling the light emitted by light source 1940 into waveguide display 1980. The light coupled into waveguide display 1980 may propagate within waveguide display 1980 through, for example, total internal reflection as described above with respect to FIG. 4. Coupler 1982 may also couple portions of the light propagating within waveguide display 1980 out of waveguide display 1980 and towards user's eye 1990.

Scanning mirror 1970 may include a microelectromechanical system (MEMS) mirror or any other suitable mirrors. Scanning mirror 1970 may rotate to scan in one or two dimensions. As scanning mirror 1970 rotates, the light emitted by light source 1940 may be directed to a different areas of waveguide display 1980 such that a full display image may be projected onto waveguide display 1980 and directed to user's eye 1990 by waveguide display 1980 in each scanning cycle. For example, in embodiments where light source 1940 includes light emitters for all pixels in one or more rows or columns, scanning mirror 1970 may be rotated in the column or row direction (e.g., x or y direction) to scan an image. In embodiments where light source 1940 includes light emitters for some but not all pixels in one or more rows or columns, scanning mirror 1970 may be rotated in both the row and column directions (e.g., both x and y directions) to project a display image (e.g., using a raster-type scanning pattern).

NED device 1950 may operate in predefined display periods. A display period (e.g., display cycle) may refer to a duration of time in which a full image is scanned or projected. For example, a display period may be a reciprocal of the desired frame rate. In NED device 1950 that includes scanning mirror 1970, the display period may also be referred to as a scanning period or scanning cycle. The light generation by light source 1940 may be synchronized with the rotation of scanning mirror 1970. For example, each scanning cycle may include multiple scanning steps, where light source 1940 may generate a different light pattern in each respective scanning step.

In each scanning cycle, as scanning mirror 1970 rotates, a display image may be projected onto waveguide display 1980 and user's eye 1990. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 1970 may revert back to the initial position to project light for the first few rows of the next display image or may rotate in a reverse direction or scan pattern to project light for the next display image, where a new set of driving signals may be fed to light source 1940. The same process may be repeated as scanning mirror 1970 rotates in each scanning cycle. As such, different images may be projected to user's eye 1990 in different scanning cycles.

Figure 20:
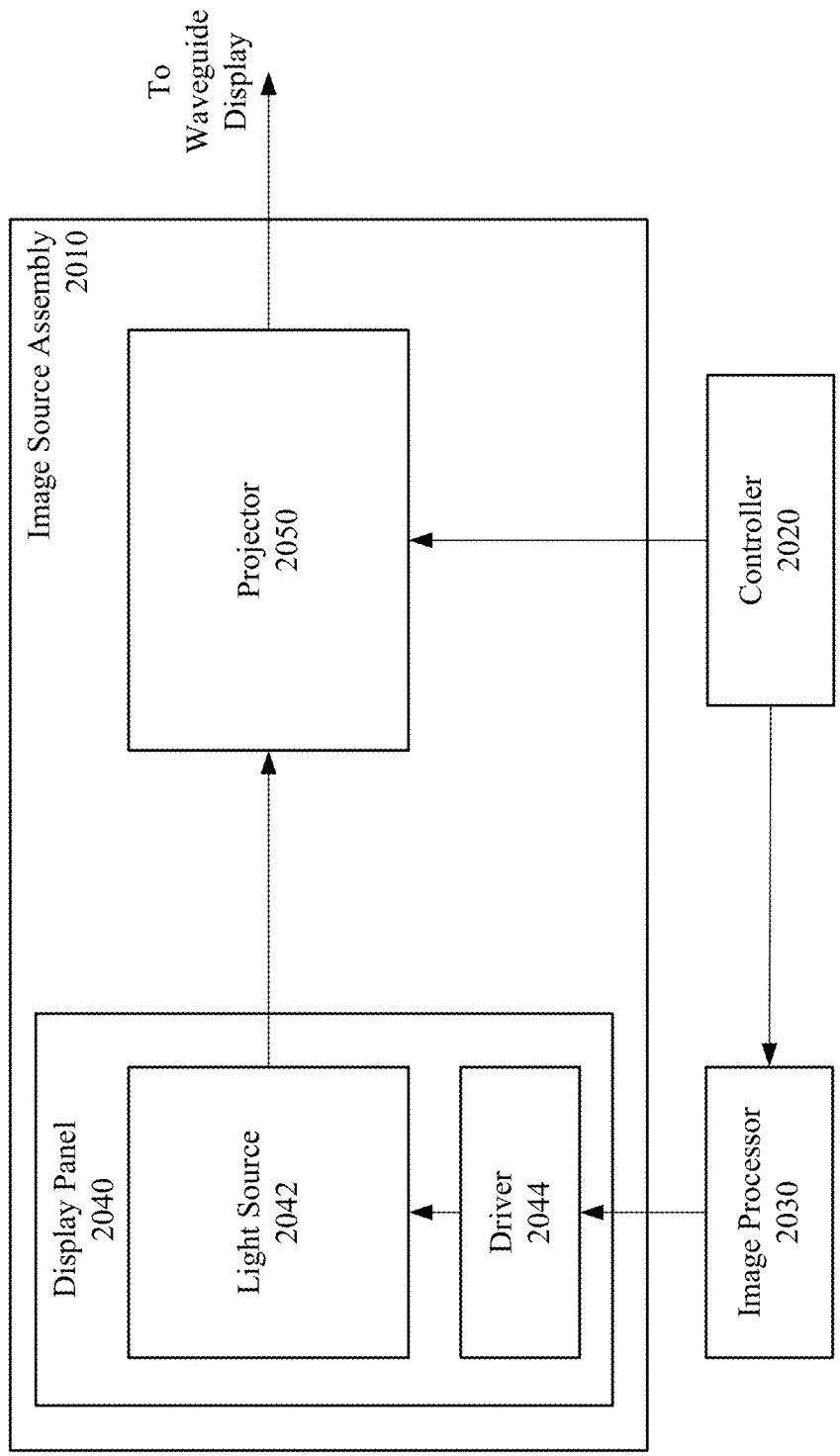
FIG. 20 illustrates an example of an image source assembly in an augmented reality system according to certain embodiments.

FIG. 20 illustrates an example of an image source assembly 2010 in a near-eye display system 2000 according to certain embodiments. Image source assembly 2010 may include, for example, a display panel 2040 that may generate display images to be projected to the user's eyes, and a projector 2050 that may project the display images generated by display panel 2040 to a waveguide display as described above with respect to FIGS. 4-5B. Display panel 2040 may include a light source 2042 and a driver circuit 2044 for light source 2042. Light source 2042 may include, for example, light source 1910 or 1960. Projector 2050 may include, for example, freeform optical element 1920, scanning mirror 1930, and/or projection optics 1970 described above. Near-eye display system 2000 may also include a controller 2020 that synchronously controls light source 2042 and projector 2050 (e.g., scanning mirror 1930). Image source assembly 2010 may generate and output an image light to a waveguide display (not shown in FIG. 20), such as waveguide display 1940 or 1980. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 2042 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 2000. In some embodiments, a display panel in accordance with an embodiment may use more than three primary colors. Each pixel in light source 2042 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 2020 may control the image rendering operations of image source assembly 2010, such as the operations of light source 2042 and/or projector 2050. For example, controller 2020 may determine instructions for image source assembly 2010 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 2010 to generate image light. The scanning instructions may specify, for example, a type of a source of image light (e.g., monochromatic or polychromatic), a scanning rate, an orientation of a scanning apparatus, one or more illumination parameters, or any combination thereof. Controller 2020 may include a combination of hardware, software, and/or firmware not shown here so as not to obscure other aspects of the present disclosure.

In some embodiments, controller 2020 may be a graphics processing unit (GPU) of a display device. In other embodiments, controller 2020 may be other kinds of processors. The operations performed by controller 2020 may include taking content for display and dividing the content into discrete sections. Controller 2020 may provide to light source 2042 scanning instructions that include an address corresponding to an individual source element of light source 2042 and/or an electrical bias applied to the individual source element. Controller 2020 may instruct light source 2042 to sequentially present the discrete sections using light emitters corresponding to one or more rows of pixels in an image ultimately displayed to the user. Controller 2020 may also instruct projector 2050 to perform different adjustments of the light. For example, controller 2020 may control projector 2050 to scan the discrete sections to different areas of a coupling element of the waveguide display (e.g., waveguide display 1940) as described above with respect to FIG. 19A. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 2030 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 2030 may be one or more circuits that are dedicated to performing certain features. While image processor 2030 in FIG. 20 is shown as a stand-alone unit that is separate from controller 2020 and driver circuit 2044, image processor 2030 may be a sub-unit of controller 2020 or driver circuit 2044 in other embodiments. In other words, in those embodiments, controller 2020 or driver circuit 2044 may perform various image processing functions of image processor 2030. Image processor 2030 may also be referred to as an image processing circuit.

In the example shown in FIG. 20, light source 2042 may be driven by driver circuit 2044, based on data or instructions (e.g., display and scanning instructions) sent from controller 2020 or image processor 2030. In one embodiment, driver circuit 2044 may include a circuit panel that connects to and mechanically holds various light emitters of light source 2042. Light source 2042 may emit light in accordance with one or more illumination parameters that are set by the controller 2020 and potentially adjusted by image processor 2030 and driver circuit 2044. An illumination parameter may be used by light source 2042 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 2042 may include multiple beams of red light, green light, and blue light, or any combination thereof.

Projector 2050 may perform a set of optical functions, such as focusing, combining, conditioning, or scanning the image light generated by light source 2042. In some embodiments, projector 2050 may include a combining assembly, a light conditioning assembly, or a scanning mirror assembly. Projector 2050 may include one or more optical components that optically adjust and potentially re-direct the light from light source 2042. One example of the adjustment of light may include conditioning the light, such as expanding, collimating, correcting for one or more optical errors (e.g., field curvature, chromatic aberration, etc.), some other adjustments of the light, or any combination thereof. The optical components of projector 2050 may include, for example, lenses, mirrors, apertures, gratings, or any combination thereof.

Projector 2050 may redirect image light via its one or more reflective and/or refractive portions so that the image light is projected at certain orientations toward the waveguide display. The location where the image light is redirected toward may depend on specific orientations of the one or more reflective and/or refractive portions. In some embodiments, projector 2050 includes a single scanning mirror that scans in at least two dimensions. In other embodiments, projector 2050 may include a plurality of scanning mirrors that each scan in directions orthogonal to each other. Projector 2050 may perform a raster scan (horizontally or vertically), a bi-resonant scan, or any combination thereof. In some embodiments, projector 2050 may perform a controlled vibration along the horizontal and/or vertical directions with a specific frequency of oscillation to scan along two dimensions and generate a two-dimensional projected image of the media presented to user's eyes. In other embodiments, projector 2050 may include a lens or prism that may serve similar or the same function as one or more scanning mirrors. In some embodiments, image source assembly 2010 may not include a projector, where the light emitted by light source 2042 may be directly incident on the waveguide display.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An optical system comprising:
   an optical waveguide;
   a micro light emitting diode configured to emit at least partially polarized light, the micro light emitting diode comprising:
      a substrate including a hexagonal lattice and having a first surface parallel to a semi-polar plane of the hexagonal lattice; and
      a plurality of layers grown on the first surface, the plurality of layers including an active layer that includes a III-nitride material and has a top surface parallel to the semi-polar plane and the first surface of the substrate; and
   a waveguide coupler configured to couple the at least partially polarized light emitted from the micro light emitting diode into the optical waveguide with a coupling efficiency higher than a coupling efficiency of the waveguide coupler for unpolarized light.

2. The optical system of claim 1, wherein the top surface of the active layer is characterized by a linear dimension less than 20 μm.

3. The optical system of claim 1, wherein an angle between the semi-polar plane and a c-plane of the hexagonal lattice is between 0° and 90°.

4. The optical system of claim 3, wherein the angle is between 45° and 90°.

5. The optical system of claim 1, wherein the semi-polar plane includes a (20$\bar{2}$1) plane of the hexagonal lattice.

6. The optical system of claim 1, wherein the at least partially polarized light is characterized by a degree of linear polarization greater than 0.5.

7. The optical system of claim 1, wherein the optical waveguide and the waveguide coupler are characterized by a polarization-dependent in-coupling efficiency.

8. The optical system of claim 1, wherein a peak efficiency current density of the micro light emitting diode is less than 1 A/cm$^2$.

9. The optical system of claim 1, wherein the substrate includes GaN, GaAs, GaP, sapphire, silicon carbide, silicon, zinc oxide, boron nitride, lithium aluminate, lithium niobate, germanium, aluminum nitride, lithium gallate, partially substituted spinel, or quaternary tetragonal oxide having a beta-LiAlO$_2$ structure.

10. The optical system of claim 1, wherein the active layer includes an InGaN multiple-quantum-well (MQW).

11. The optical system of claim 1, wherein the plurality of layers forms a mesa on the first surface of the substrate.

12. The optical system of claim 11, wherein the mesa is characterization by a vertical, conical, semi-parabolic, or parabolic shape.

13. The optical system of claim 11, wherein the micro light emitting diode further comprises a passivation layer on one or more surfaces of the mesa.

14. The optical system of claim 13, wherein the passivation layer is configured to reflect the at least partially polarized light emitted by the micro light emitting diode.

15. The optical system of claim 13, wherein the passivation layer is configured to collimate the at least partially polarized light emitted by the micro light emitting diode.

16. The optical system of claim 1, wherein the waveguide coupler includes a lens, a micro-lens, a grating, or a prism.

17. A display device comprising:
   a micro light emitting diode (micro-LED) configured to emit at least partially polarized light, the micro-LED comprising:
      a substrate including a hexagonal lattice and having a first surface parallel to a semi-polar plane of the hexagonal lattice; and
      a plurality of layers grown on the first surface, the plurality of layers including an active layer that includes a III-nitride material and has a top surface parallel to the semi-polar plane and the first surface of the substrate;
   a waveguide display;
   a waveguide coupler configured to couple the at least partially polarized light from the micro-LED into the waveguide display such that the coupled light is guided by the waveguide display to propagate in the waveguide display, the waveguide coupler characterized by a higher coupling efficiency for the at least partially polarized light than for unpolarized light; and
   an output coupler coupled to the waveguide display and configured to couple the light propagating in the waveguide display out of the waveguide display.

18. The display device of claim 17, wherein an angle between the semi-polar plane and a c-plane of the hexagonal lattice is between 45° and 90°.

19. The display device of claim 17, wherein the semi-polar plane includes a (20$\bar{2}$1) plane of the hexagonal lattice.

20. The display device of claim 17, wherein the at least partially polarized light is characterized by a degree of linear polarization greater than 0.5.

* * * * *